United States Patent
Ko et al.

(10) Patent No.: US 11,152,431 B2
(45) Date of Patent: Oct. 19, 2021

(54) SEMICONDUCTOR MEMORY DEVICE

(71) Applicant: SK hynix Inc., Icheon (KR)

(72) Inventors: Young-Seok Ko, Suwon (KR);
Jung-Hun Lee, Suwon (KR);
Hyun-Min Lee, Sejong (KR);
Hyun-Jin Lee, Icheon (KR)

(73) Assignee: SK hynix Inc., Icheon (KR)

( * ) Notice: Subject to any disclaimer, the term of this patent is extended or adjusted under 35 U.S.C. 154(b) by 30 days.

(21) Appl. No.: 16/572,458

(22) Filed: Sep. 16, 2019

(65) Prior Publication Data

US 2020/0321398 A1 Oct. 8, 2020

(30) Foreign Application Priority Data

Apr. 4, 2019 (KR) .................. 10-2019-0039603

(51) Int. Cl.
*H01L 27/24* (2006.01)
*H01L 45/00* (2006.01)

(52) U.S. Cl.
CPC ...... *H01L 27/2481* (2013.01); *H01L 27/2427* (2013.01); *H01L 45/06* (2013.01); *H01L 45/126* (2013.01); *H01L 45/1233* (2013.01); *H01L 45/144* (2013.01); *H01L 45/1675* (2013.01)

(58) Field of Classification Search
CPC . H01L 27/2481; H01L 27/2427; H01L 45/06; H01L 45/1233; H01L 45/126; H01L 45/144; H01L 45/1675
See application file for complete search history.

(56) References Cited

U.S. PATENT DOCUMENTS

2017/0271592 A1* 9/2017 Lee .................. H01L 27/2427
2020/0265872 A1* 8/2020 Ota ........................ G11C 5/063

FOREIGN PATENT DOCUMENTS

KR 101058318 B1 8/2011

* cited by examiner

*Primary Examiner* — Shaun M Campbell

(57) ABSTRACT

An electronic device includes a semiconductor memory. The semiconductor memory comprises a first variable resistance element coupled between a first wiring and a second wiring, the first variable resistance element including a first variable resistance layer having a first width at a first distance from the first wiring; and a second variable resistance element coupled between the second wiring and a third wiring, the second variable resistance element including a second variable resistance layer having a second width at the first distance from the second wiring. The first width is greater than the second width.

22 Claims, 21 Drawing Sheets

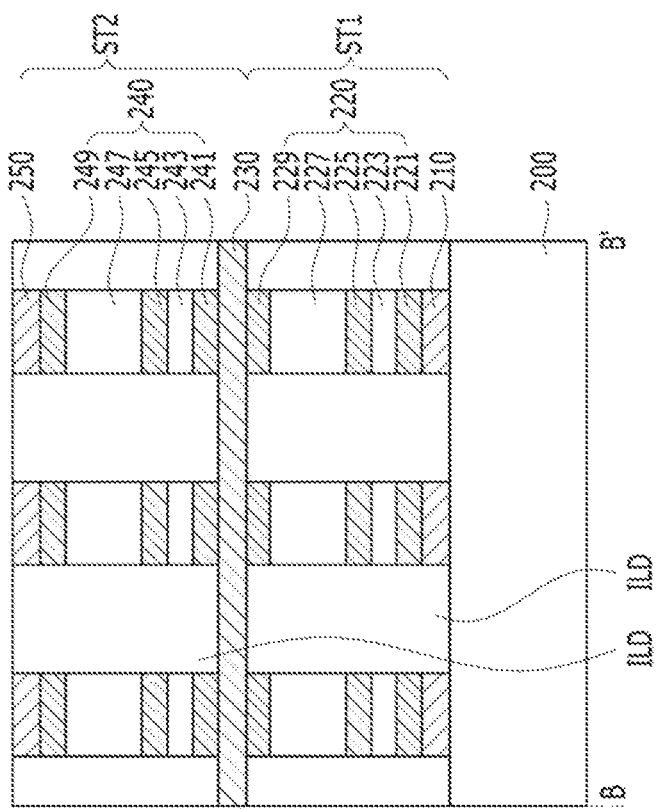
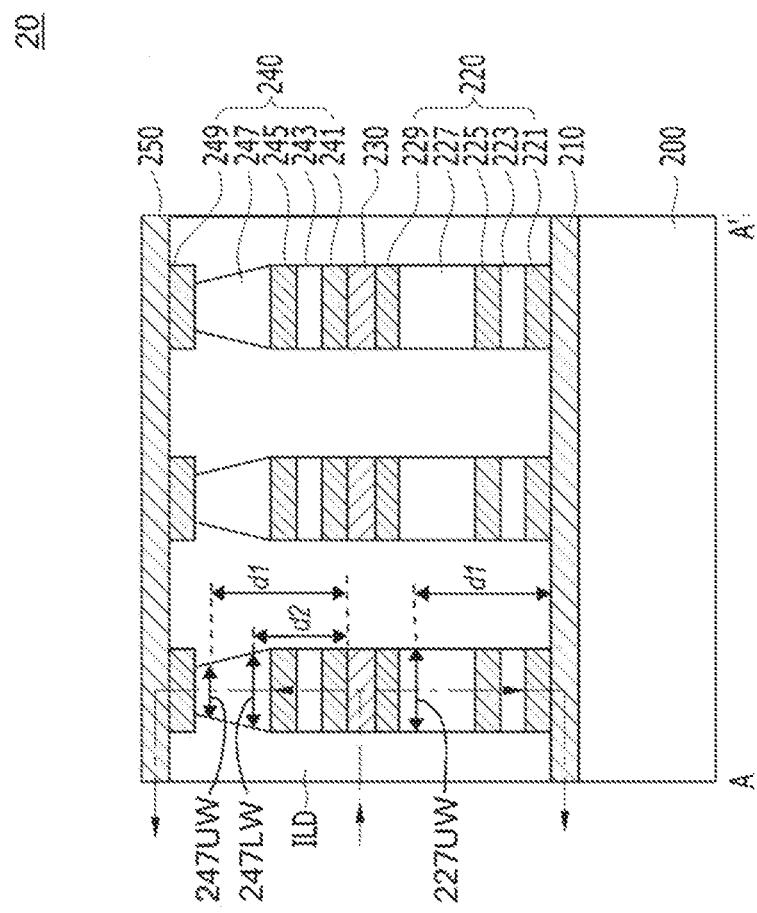
FIG. 4A
FIG. 4B

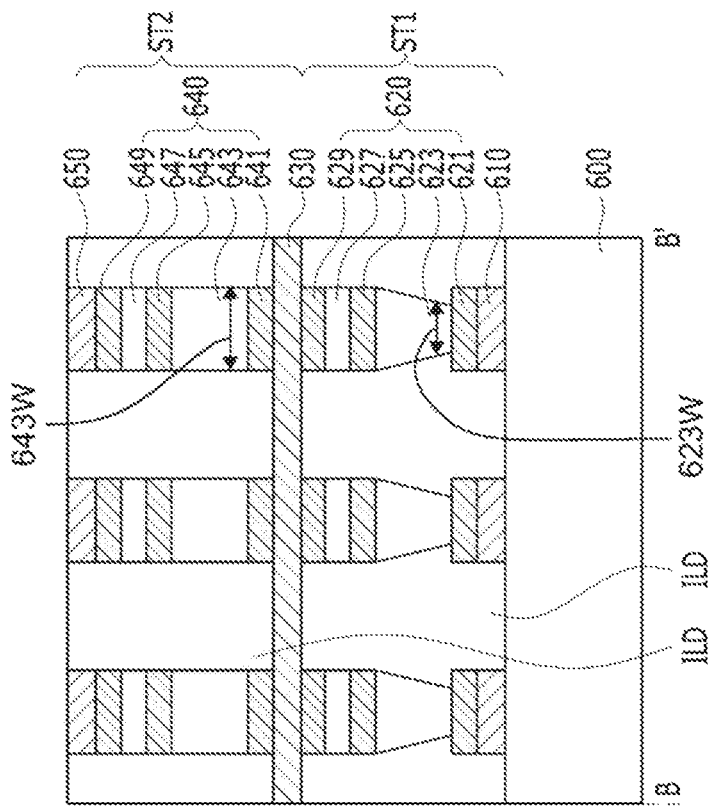
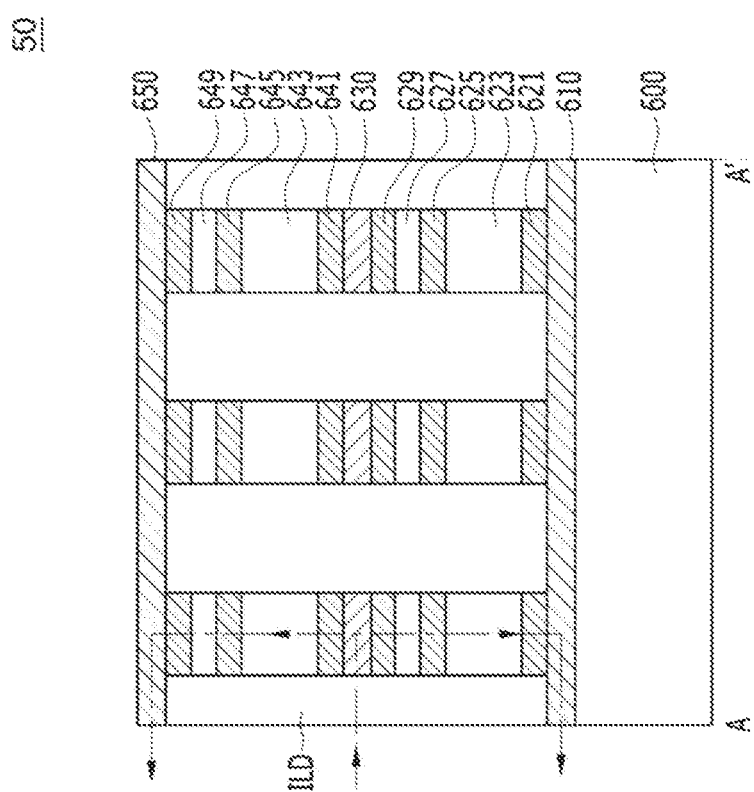
FIG. 10B
FIG. 10A

SEMICONDUCTOR MEMORY DEVICE

CROSS-REFERENCE TO RELATED APPLICATION

This application claims priority under 35 U.S.C. § 119 to Korean Patent Application No. 10-2019-0039603 filed on Apr. 4, 2019, which is incorporated herein by reference in its entirety.

BACKGROUND

1. Field

This patent document relates to memory circuits or devices and their applications in electronic devices or systems.

2. Discussion of the Related Art

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted regarding such semiconductor devices. Such semiconductor devices include semiconductor devices which can store data using materials that switch between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

Various embodiments are directed to a memory device capable of improving operation characteristics and an electronic device including the same.

In an embodiment, there is provided an electronic device including a semiconductor memory. The semiconductor memory may include: a first wiring, a second wiring and a third wiring that are arranged so as to be isolated from one another, wherein the second wiring is extended in a direction intersecting the first and third wirings; a first variable resistance element interposed between the first and second wirings, overlapping an intersection between the first and second wirings, and including a first variable resistance layer; and a second variable resistance element interposed between the second and third wirings, overlapping an intersection between the second and third wirings, and including a second variable resistance layer. A first width of the first variable resistance layer at a first location in the arrangement direction of the first to third wirings may be different from a second width of the second variable resistance layer at a second location corresponding to the first location.

In the electronic device, during a set operation, the direction of a current flowing through the first variable resistance element may coincide with a temperature increase direction in the first variable resistance element, and during the set operation, the direction of a current flowing through the second variable resistance element may be opposite to a temperature increase direction in the second variable resistance element. The second width may be smaller than the first width. A change in width of the second variable resistance layer may be larger than a change in width of the first variable resistance layer.

The first and second variable resistance layers may include a phase change material, and crystal growth directions of the first and second variable resistance layers may coincide with the directions of currents flowing through the first and second variable resistance elements, respectively. When the direction of the current flowing through the first variable resistance element is a direction from the first wiring to the second wiring, the direction of the current flowing through the second variable resistance element may be a direction from the third wiring to the second wiring. When the direction of the current flowing through the first variable resistance element is a direction from the second wiring to the first wiring, the direction of the current flowing through the second variable resistance element may be a direction from the second wiring to the third wiring. During the set operation, the temperature increase direction of the first variable resistance element and the temperature increase direction of the second variable resistance element may coincide with each other.

The first variable resistance element may further include a first selection element layer, and the second variable resistance element may further include a second selection element layer. During the set operation, the temperature increase direction of the first variable resistance element may be a direction from the first variable resistance layer to the first selection element layer. During the set operation, the temperature increase direction of the second variable resistance element may be a direction from the second variable resistance layer to the second selection element layer. When a current flows from a third location toward the second location in the second variable resistance layer, a width of the second variable resistance layer at the third location may be larger than the second width of the second variable resistance layer at the second location. The width of the second variable resistance layer may decrease in a gradual or stepwise manner from the third location to the second location. A part of the second variable resistance layer at the third location and a part of the second variable resistance layer at the second location may be formed of different materials.

A current may flow from the second wiring toward the first and third wirings. During a set operation, the temperature of the first variable resistance element may increase in a direction from the second wiring to the first wiring. During the set operation, the temperature of the second variable resistance element may increase in a direction from the third wiring to the second wiring. The first location may be closer to the other surface of the first variable resistance layer facing the second wiring than one surface of the first variable resistance layer facing the first wiring, and the second width of the second variable resistance layer may be smaller than the first width of the first variable resistance layer.

A current may flow from the first and third wirings toward the second wiring. During a set operation, the temperature of the first variable resistance element may increase in a direction from the second wiring to the first wiring. During the set operation, the temperature of the second variable resistance element may increase in a direction from the third wiring to the second wiring. The first location may be closer to the other surface of the first variable resistance layer facing the second wiring than one surface of the first variable resistance layer facing the first wiring, and the second width of the second variable resistance layer may be larger than the first width of the first variable resistance layer.

A current may flow from the second wiring toward the first and third wirings. During a set operation, the temperature of the first variable resistance element may increase in a direction from the first wiring to the second wiring. During the set operation, the temperature of the second variable resistance element may increase in a direction from the second wiring to the third wiring. The first location may be closer to one surface of the first variable resistance layer facing the first wiring than the other surface of the first variable resistance layer facing the second wiring, and the first width of the first variable resistance layer may be smaller than the second width of the second variable resistance layer.

A current may flow from the first and third wirings toward the second wiring. During a set operation, the temperature of the first variable resistance element may increase in a direction from the first wiring to the second wiring. During the set operation, the temperature of the second variable resistance element may increase in a direction from the second wiring to the third wiring. The first location may be closer to one surface of the first variable resistance layer facing the first wiring than the other surface of the first variable resistance layer facing the second wiring, and the second width of the second variable resistance layer may be smaller than the first width of the first variable resistance layer.

The semiconductor memory may further include: a fourth wiring disposed at one side of the third wiring in the arrangement direction of the first to third wirings so as to be isolated from the third wiring, and extended in a direction intersecting the third wiring; and a third variable resistance element interposed between the third and fourth wirings, overlapping an intersection between the third and fourth wirings, and including a third variable resistance layer. The third variable resistance layer may have the same width as the first variable resistance layer.

The semiconductor memory may further include: a fifth wiring disposed at one side of the fourth wiring in the arrangement direction of the first to third wirings so as to be isolated from the fourth wiring, and extended in a direction intersecting the fourth wiring; and a fourth variable resistance element interposed between the fourth and fifth wirings, overlapping an intersection between the fourth and fifth wirings, and including a fourth variable resistance layer. The fourth variable resistance layer may have the same width as the second variable resistance layer.

In an embodiment, there is provided an electronic device including a semiconductor memory. The semiconductor memory may include: a first wiring, a second wiring and a third wiring that are arranged so as to be isolated from one another, wherein the second wiring is extended in a direction intersecting the first and third wirings; a first variable resistance element interposed between the first and second wirings, overlapping an intersection between the first and second wirings, and including a first variable resistance layer; and a second variable resistance element interposed between the second and third wirings, overlapping an intersection between the second and third wirings, and including a second variable resistance layer. During a set operation, the direction of a current flowing through the first variable resistance element may coincide with a temperature increase direction in the first variable resistance element, the direction of a current flowing through the second variable resistance element may be opposite to a temperature increase direction in the second variable resistance element, and a width of the second variable resistance layer at a second location may be larger than a width of the second variable resistance layer at a first location, when a current flows from the second location to the first location in the second variable resistance layer.

In the electronic device, a change in width of the second variable resistance layer may be larger than a change in width of the first variable resistance layer. The first and second variable resistance layers may include a phase change material, and crystal growth directions of the first and second variable resistance layers may coincide with the directions of currents flowing through the first and second variable resistance elements, respectively. When the direction of the current flowing through the first variable resistance element is a direction from the first wiring to the second wiring, the direction of the current flowing through the second variable resistance element may be a direction from the third wiring to the second wiring. When the direction of the current flowing through the first variable resistance element is a direction from the second wiring to the first wiring, the direction of the current flowing through the second variable resistance element may be a direction from the second wiring to the third wiring. During a set operation, the temperature increase direction of the first variable resistance element and the temperature increase direction of the second variable resistance element may coincide with each other.

The first variable resistance element may further include a first selection element layer, and the second variable resistance element may further include a second selection element layer. During a set operation, the temperature increase direction of the first variable resistance element may be a direction from the first variable resistance layer to the first selection element layer. During the set operation, the temperature increase direction of the second variable resistance element may be a direction from the second variable resistance layer to the second selection element layer. The width of the second variable resistance layer may decrease in a gradual or stepwise manner from the second location to the first location. A part of the second variable resistance layer at the first location and a part of the second variable resistance layer at the second location may be formed of different materials.

A current may flow from the second wiring to the first and third wirings. During a set operation, the temperature of the first variable resistance element may increase in a direction from the second wiring to the first wiring. During the set operation, the temperature of the second variable resistance element may increase in a direction from the third wiring to the second wiring. The first location may be closer to the third wiring than the second location. A current may flow from the first and third wirings toward the second wiring. During a set operation, the temperature of the first variable resistance element may increase in a direction from the second wiring to the first wiring. During the set operation, the temperature of the second variable resistance element may increase in a direction from the third wiring to the second wiring. The first location may be closer to the second wiring than the second location.

A current may flow from the second wiring toward the first and third wirings, wherein during a set operation. The temperature of the first variable resistance element may increase in a direction from the first wiring to the second wiring. During the set operation, the temperature of the second variable resistance element may increase in a direction from the second wiring to the third wiring. The first location may be closer to the first wiring than the second location.

A current may flow from the first and third wirings toward the second wiring. During a set operation, the temperature of the first variable resistance element may increase in a direction from the first wiring to the second wiring. During the set operation, the temperature of the second variable resistance element may increase in a direction from the second wiring to the third wiring. The first location may be closer to the second wiring than the second location.

The semiconductor memory may further include: a fourth wiring disposed at one side of the third wiring in the arrangement direction of the first to third wirings so as to be isolated from the third wiring, and extended in a direction intersecting the third wiring; and a third variable resistance element interposed between the third and fourth wirings, overlapping an intersection between the third and fourth wirings, and including a third variable resistance layer. The third variable resistance layer may have the same width as the first variable resistance layer.

The semiconductor memory may further include: a fifth wiring disposed at one side of the fourth wiring in the arrangement direction of the first to third wirings so as to be isolated from the fourth wiring, and extended in a direction intersecting the fourth wiring; and a fourth variable resistance element interposed between the fourth and fifth wirings, overlapping an intersection between the fourth and fifth wirings, and including a fourth variable resistance layer. The fourth variable resistance layer may have the same width as the second variable resistance layer.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted from an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted from an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

BRIEF DESCRIPTION OF THE DRAWINGS

FIGS. 2A and 2B is a phase change material.

FIGS. 2A and 2B is a phase change material.

FIGS. 4A and 4B show cross-sectional views illustrating a memory device in accordance with an embodiment, respectively taken along the lines A-A' and B-B' of FIG. 1.

FIGS. 10A and 10B are cross-sectional views illustrating a memory device in accordance with an embodiment, respectively taken along the lines A-A' and B-B' of FIG. 1.

DETAILED DESCRIPTION

Figure 1:
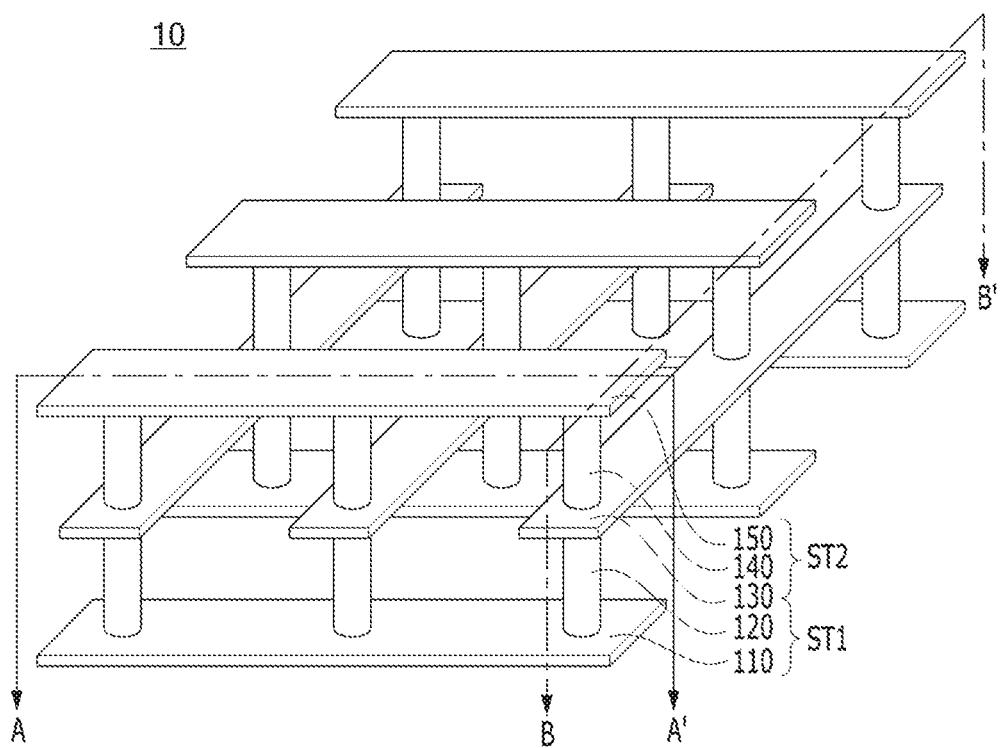
FIG. 1 is a perspective view illustrating a memory device in accordance with an embodiment.

Hereafter, various embodiments will be described in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 is a perspective view illustrating a memory device 10 in accordance with an embodiment.

Referring to FIG. 1, the memory device 10 in accordance with the present embodiment may include a first stacked structure ST1 and a second stacked structure ST2. The first stacked structure ST1 may include a first word line disposed on a substrate 100 and extended in a first direction, for example, a direction parallel to the line A-A', a common bit line 130 extended in a second direction substantially perpendicular to the first word line 110, for example, a direction parallel to the line B-B' over the first word line 110, and a first variable resistance element 120 interposed between the first word line 110 and the common bit line 130 while overlapping an intersection between the first word line 110 and the common bit line 130. The second stacked structure ST2 may include the common bit line 130, a second word line 150 extended in the first direction over the common bit line 130, and a second variable resistance element 140 interposed between the common bit line 130 and the second word line 150 while overlapping an intersection between the common bit line 130 and the second word line 150.

The first word line 110 and the common bit line 130 may be coupled to the bottom and top of the first variable resistance element 120, respectively, and serve to supply a current or voltage to the first variable resistance element 120, and the common bit line 130 and the second word line 150 may be coupled to the bottom and top of the second variable resistance element 140, respectively, and serve to supply a current or voltage to the second variable resistance element 140. The common bit line 130 may be shared by the first and second stacked structures ST1 and ST2, and used to drive the first and second stacked structures ST1 and ST2 at the same time. The first word line 110, the common bit line 130 and the second word line 150 may have a single-layer or multilayer structure including various conductive materials, for example, metals such as Pt, Ir, Ru, Al, Cu, W, Ti and Ta or conductive metal nitrides such as TiN, TaN, WN and MoN.

Each of the first and second variable resistance elements 120 and 140 may include a variable resistance material which switches between different resistance states according to a current or voltage supplied across the variable resistance element, and thus function as a memory cell for storing different data. The first and second variable resistance elements 120 and 140 may have various structures under the supposition that they include a variable resistance material, and switch between different resistance states in various manners.

Figure 2A:
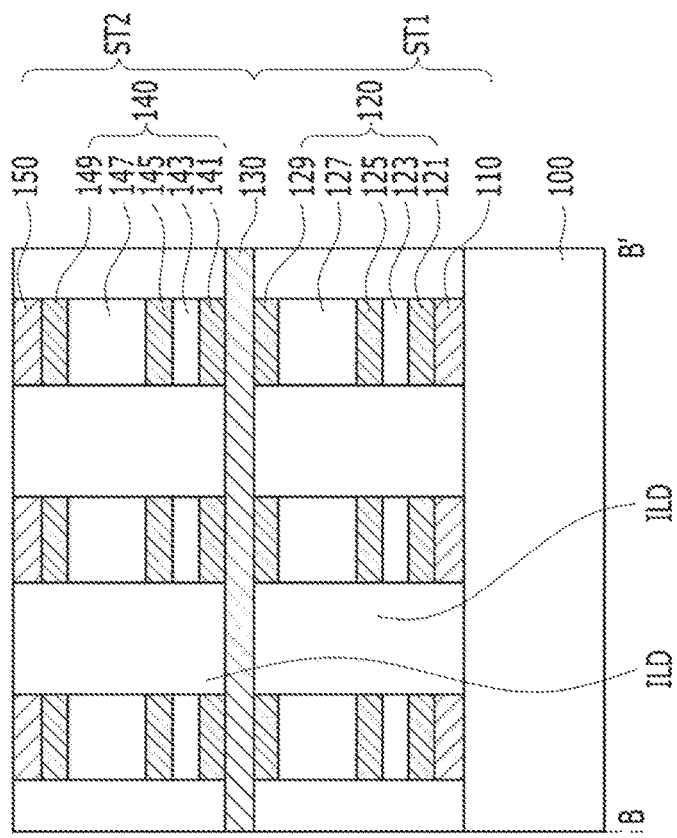
FIGS. 2A and 2B are a cross-sectional views illustrating a memory device, taken respectively along lines A-A' and B-B' of FIG. 1.
Figure 2B:
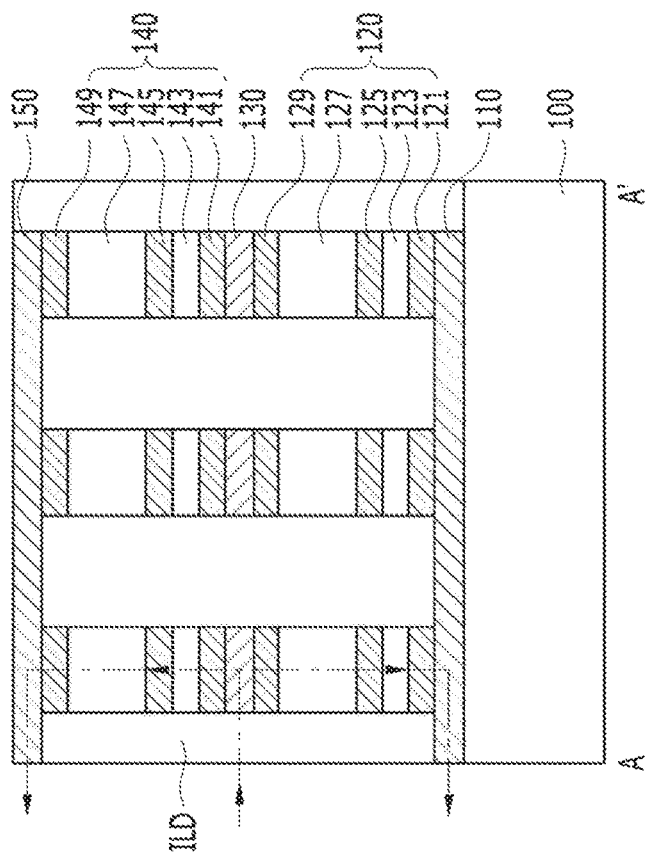

FIGS. 2A and 2B are cross-sectional views respectively taken along lines A-A' and B-B' of a memory device having a configuration such as the configuration shown in FIG. 1. In the device of FIGS. 2A and 2B, the first variable resistance element 120 includes a first bottom electrode layer 121, a first selection element layer 123 disposed above the first bottom electrode layer 121, a first intermediate electrode layer 125 disposed above the first selection element layer 123, a first variable resistance layer 127 disposed above the first intermediate electrode layer 125 and a first top electrode layer 129 disposed above the first variable resistance layer 127.

The first bottom electrode layer 121 may serve as a current path between the first word line 110 and the first variable resistance element 120, and may have a single-layer or multilayer structure including a low-resistance conductive material, for example, a metal, carbon or conductive metal nitride. The metal or conductive metal nitride may further include carbon. In another embodiment, the first bottom electrode layer 121 may be omitted.

The first selection element layer 123 may have a threshold switching characteristic or on-off switching characteristic in which the first selection element layer 123 interrupts or rarely pass a current when the magnitude of a voltage supplied to the top and bottom thereof is less than a predetermined threshold voltage, and rapidly passes a current when the magnitude of the voltage supplied to the top and bottom thereof is equal to or more than the threshold voltage or more, thereby controlling current flow to the first variable resistance layer 127. The first selection element layer 123 may include, for example, a diode, an ovonic threshold switching (OTS) material such as a chalcogenide-based material, a mixed ionic electronic conducting (MIEC) material such as a metal-containing chalcogenide-based material, a metal insulator transition material (MIT) such as $NbO_2$ or $VO_2$, or a tunneling dielectric layer having a relatively wide bandgap, such as $SiO_2$ or $Al_2O_3$.

The first intermediate electrode layer 125 may function as a current path between the first selection element layer 123 and the first variable resistance layer 127 while physically isolating the first selection element layer 123 and the first variable resistance layer 127 from each other. The first intermediate electrode layer 125 may have a single-layer or multilayer structure including a low-resistance conductive material, for example, a metal, carbon, or a conductive metal nitride. The metal or conductive metal nitride may further include carbon.

The first variable resistance layer 127 may have a characteristic of switching between different resistance states according to a voltage or current supplied to the top and bottom thereof. The variable resistance layer 127 may have a single-layer structure including a single material and having a variable resistance characteristic or a multilayer structure including a combination of two or more layers and having a variable resistance characteristic. For example, the first variable resistance layer 127 may have a single-layer or multilayer structure including a material used for RRAM, PRAM, MRAM, FRAM or the like, that is, metal oxide such as perovskite-based oxide or transition metal oxide, a phase change material such as a chalcogenide compound, a ferroelectric material or a ferromagnetic material.

In the present embodiment, the first variable resistance layer 127 may include a phase change material. In this case, the first variable resistance layer 127 may switch between an amorphous state and a crystalline state due to Joule's heat which is generated according to a current flowing through the top and bottom thereof. When the first variable resistance layer 127 is in the amorphous state, the first variable resistance layer 127 may be in a relatively high resistance state. On the other hand, when the first variable resistance layer 127 is in the crystalline state, the first variable resistance layer 127 may be in a low resistance state. Through such a resistance difference of the phase change material, data may be stored. However, the present embodiment is not limited thereto. When the resistance state switching of the first variable resistance layer 127 is performed or affected by heat, the first variable resistance layer 127 may include a variable resistance material having a variable resistance characteristic in various manners.

When the first variable resistance layer 127 includes a chalcogenide-based material as a phase change material, the first variable resistance layer 127 may include Germanium (Ge)-Antimony(Sb)-Tellurium(Te) (GST), for example. The chemical composition ratio of Ge, Sb and Te within the first variable resistance layer 127 may be modified in various manners. For example, Ge—Sb—Te may include $Ge_2Sb_2Te_5$, $Ge_2Sb_2Te_7$, $Ge_1Sb_2Te_4$ or $Ge_1Sb_4Te_7$. However, the present embodiment is not limited thereto, and in embodiments the first variable resistance layer 127 may include various chalcogenide materials other than the above-described GST. For example, the first variable resistance layer 127 may include a combination of two or more selected from silicon (Si), germanium (Ge), antimony (Sb), tellurium (Te), bismuth (Bi), indium (In), tin (Sn) and selenium (Se). The chemical composition ratio of elements included in the first variable resistance layer 127 may be modified in various manners. Furthermore, the first variable resistance layer 127 may further include one or more dopants selected from boron (B), carbon (C), nitrogen (N), oxygen (O), phosphorus (P) and sulfur (S).

According to the chemical composition ratio of the elements composing the first variable resistance layer 127 and/or the dopants included in the first variable resistance layer 127, the characteristics of the first variable resistance layer 127 may be adjusted, which include crystallization temperature, a melting point, phase change speed, a driving current, an information retention force and the like. The first variable resistance layer 127 may have a single-layer structure or a multilayer structure including two or more different phase change material layers stacked therein.

When the above-described first selection element layer 123 includes a chalcogenide-based material as an OTS material, the first selection element layer 123 may include a chalcogenide-based material different from the first variable resistance layer 127, that is, a chalcogenide-based material including different types of elements or having a different chemical composition ratio, or including different types of impurities. For example, the first selection element layer 123 may be composed of Ge, Se and Sb. Although the first selection element layer 123 and the first variable resistance layer 127 include a chalcogenide-based material, the types or chemical composition ratio of elements composing each of the first selection element layer 123 and the first variable resistance layer 127 or the types of impurities included therein may be changed so that the first selection element layer 123 can exhibit an on-off switching characteristic and the first variable resistance layer 127 can exhibit a variable resistance characteristic. In particular, the first selection element layer 123 may exhibit a non-persistent voltage-driven on-off switching characteristic, while the variable resistance layer 127 may exhibit a persistent temperature-driven variable resistance characteristic.

Herein, the first selection element layer 123 may prevent a current flow as long as a voltage across the first selection element layer 123 is less than a selection layer threshold voltage, and once a voltage equal to or greater than the selection layer threshold voltage is applied, may allow the current flow as long as the current flow is greater than or equal to a holding current The first variable resistance layer 127 may allow a current flow in both of a low resistance state and a high resistance state. When the first variable resistance layer 127 is in the high resistance state (e.g., an amorphous state), the first variable resistance layer 127 may pass a current much lower than in the low resistance state (e.g., a crystalline state), which does not indicate that the first variable resistance layer 127 interrupts a current flow. When the first variable resistance layer 127 is in the amorphous state and a voltage applied across the first variable resistance layer 127 is greater than or equal to the variable resistance layer threshold voltage, the first variable resistance layer 127 may enter a non-persistent switched state wherein the resistance of the first variable resistance layer 127 decreases substantially, allowing more current to flow through the first variable resistance layer 127.

Therefore, the first selection element layer 123 may be formed of a material having higher on-state resistance than the resistance of the first variable resistance layer 127 in the non-persistent switched state. Thus, as will be described below, the temperature of the first selection element layer 123 in the first variable resistance element 120 may be higher than temperatures of the other layers.

The first top electrode layer 129 may be disposed at the uppermost part of the first variable resistance element 120 to connect the common bit line 130 and the first variable resistance element 120, and have a single-layer or multilayer structure including a low-resistance conductive material, for example, a metal, carbon or metal nitride. The metal or conductive metal nitride may further include carbon.

The second variable resistance element 140 may have substantially the same structure as the first variable resistance element 120, and thus include a second bottom electrode layer 141, a second selection element layer 143, a second intermediate electrode layer 145, a second variable resistance layer 147 and a second top electrode layer 149 respectively corresponding to the first bottom electrode layer 121, the first selection element layer 123, the first intermediate electrode layer 125, the first variable resistance layer 127 and the first top electrode layer 129. One or more elements of the second variable resistance element 140 may have substantially the same materials, thicknesses and widths as the corresponding elements of the first variable resistance element 120.

Each of the first and second variable resistance elements 120 and 140 may have an island shape. In the embodiment shown in FIGS. 2A and 2B, both sidewalls of the first variable resistance element 120 may be aligned with both sidewalls of the common bit line 130 in the first direction, and both sidewalls of the first variable resistance element 120 may be aligned with both sidewalls of the first word line 110 in the second direction. Similarly, both sidewalls of the second variable resistance element 140 may be aligned with both sidewalls of the common bit line 130 in the first direction, and both sidewalls of the second variable resistance element 140 may be aligned with both sidewalls of the second word line 150 in the second direction. This is because the first variable resistance element 120 is patterned with the first word line 110 and the common bit line 130, and the second variable resistance element 140 is patterned with the common bit line 130 and the second word line 150. However, the embodiments of the present disclosure are not limited thereto, but the first variable resistance element 120 may be patterned separately from the first word line 110 and the common bit line 130 such that the sidewalls thereof are not aligned with the sidewalls of the first word line 110 and the common bit line 130, and the second variable resistance element 140 may be patterned separately from the common bit line 130 and the second word line 150 such that the sidewalls thereof are not aligned with the sidewalls of the common bit line 130 and the sidewalls of the second word line 150.

Symbol ILD which is not described may represent an interlayer dielectric layer disposed between the first word lines 110, between the first variable resistance elements 120, between the common bit lines 130, between the second variable resistance elements 140, and between the second word lines 150.

In the memory device of FIGS. 2A and 2B, the first and second variable resistance elements 120 and 140 may have the same structure but have different operation characteristics. This is because the first and second variable resistance elements 120 and 140 share the common bit line 130 such that the direction of a current flowing through the first variable resistance element 120 is opposite to the direction of a current flowing through the second variable resistance element 140. For example, as indicated by dotted arrows in FIGS. 2A and 2B, the current in the first variable resistance element 120 may flow from the common bit line 130 toward the first word line 110, i.e. from top to bottom, but the current in the second variable resistance element 140 may flow from the common bit line 130 toward the second word line 150, i.e. from bottom to top. Phenomena which may occur in each case will be described in more detail with reference to FIGS. 3A to 3D.

Figure 3A:
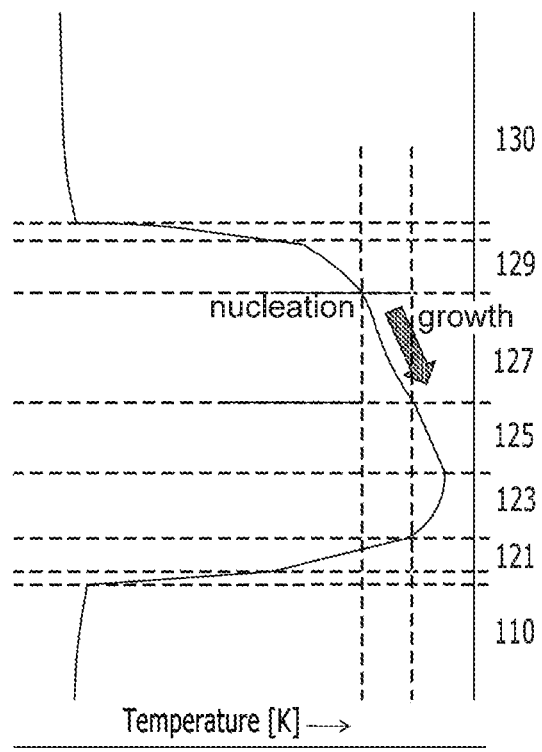
FIG. 3A illustrates a temperature profile of a first stacked structure ST1 in the memory device of FIGS. 1 and 2.
Figure 3B:
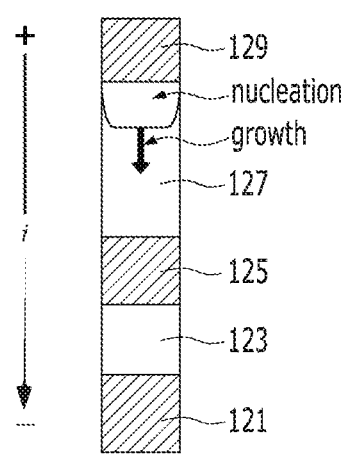
FIG. 3B illustrates a crystallization process when a first variable resistance layer 127 of the memory device of FIG. 1
Figure 3C:
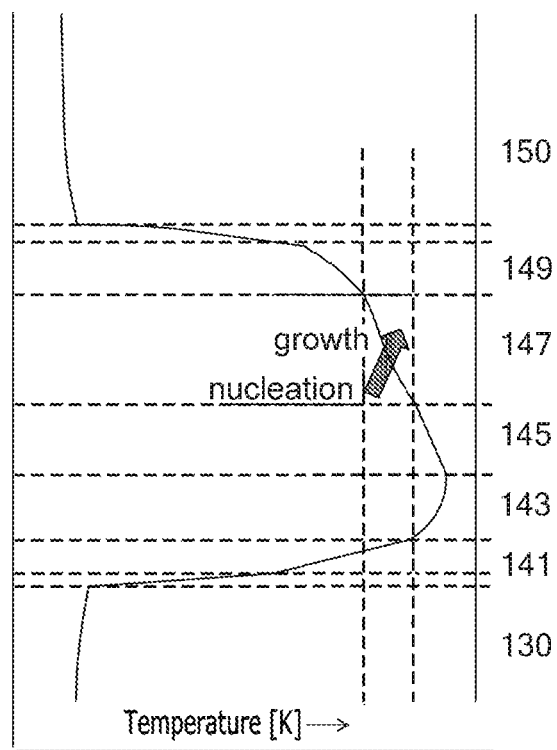
FIG. 3C illustrates a temperature profile of a second stacked structure ST2 in the memory device of FIGS. 2A and 2B.
Figure 3D:
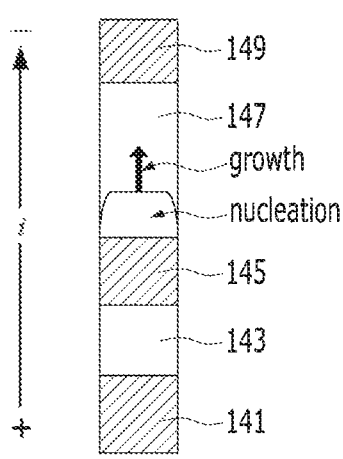
FIG. 3D illustrates a crystallization process when a second variable resistance layer 147 of the memory device of FIG. 1

FIG. 3A is a graph illustrating a temperature profile of the first stacked structure ST1 in the memory device of FIGS. 1 and 2, FIG. 3B is a diagram for describing a crystallization process when the first variable resistance layer 127 of the memory device of FIGS. 1 and 2 is a phase change material, FIG. 3C is a graph illustrating a temperature profile of the second stacked structure ST2 in the memory device of FIGS. 1 and 2, and FIG. 3D is a diagram for describing a crystallization process when the second variable resistance layer 147 of the memory device of FIGS. 1 and 2 is a phase change material.

FIGS. 3A to 3D illustrate behavior during a set operation of a variable resistance element (such as the first or second variable resistance element 120 or 140) when the variable resistance element is in the high resistance (amorphous) state. In the set operation, the selection element layer is switched on, and a voltage greater than the variable resistance layer threshold voltage is applied to the variable resistance layer. The applied voltage being higher than the variable resistance layer threshold voltage causes the variable resistance layer to enter the non-persistent switched state having a lower resistance. As a result, a setting current may flow through the variable resistance layer.

The setting current flowing through the variable resistance layer heats the variable resistance layer, which anneals the variable resistance layer, causing it to transition over time from the amorphous state to a crystalline state. Because of field-induced nucleation at the more-positive side of variable resistance layer, the crystallization tends to begin at the more-positive side of the variable resistance layer, and proceed from there in the direction of the current flow through the variable resistance layer.

As described above, the first selection element layer 123 needs to be able to interrupt a current when off, which may result in the first selection element layer 123 having a higher resistance when on. As a result, during the set operation described above, the first selection element layer 123 may have the highest resistance among the layers constituting the first stacked structure ST1, higher than that of the switched state of the first variable resistance layer 127. Furthermore, since the first word line 110, the first bottom electrode layer 121, the first intermediate electrode layer 125, the first top electrode layer 129 and the common bit line 130 are conductive materials, they may naturally have lower resistance than the first selection element layer 123. Therefore, since the heat generated by the setting current in each layer is proportional to the resistance of that layer, the temperature profile of FIG. 3A shows that, during the set operation, the first selection element layer 123 in the first stacked structure ST1 has the highest temperature and the temperature of the first stacked structure ST1 decreases from the first selection element layer 123 in both directions, that is, towards the first word line 110 and towards the common bit line 130. For this reason, the temperature of the first variable resistance layer 127 may increase in the direction from the interface with the first top electrode layer 129 to the interface with the first intermediate electrode layer 125.

As described above, the current in the first variable resistance element 120 may flow from the common bit line 130 toward the first word line 110, i.e. from top to bottom. As a result, referring to FIG. 3B, during the set operation, the phase change material forming the first variable resistance layer 127 begins nucleation at the interface with the first top electrode layer 129, and crystal growth may occur in the direction from top to bottom as the nuclei formed in the nucleation grow and merge.

As a result, referring to FIGS. 3A and 3B, the crystallization direction of the phase change material in the first variable resistance layer 127 may coincide with the temperature increase direction. Therefore, the crystallization may be relatively quick.

The second selection element layer 143 has characteristics similar to the first selection element layer 123 described above. Thus, during a set operation, the second selection element layer 143 may have the highest resistance among the layers constituting the second stacked structure ST2. Therefore, the temperature profile of FIG. 3C shows that, during the set operation, the second selection element layer 143 in the second stacked structure ST2 has the highest temperature and the temperature of the second stacked structure ST2 decreases from the second selection element layer 143 in directions, that is, towards the common bit line 130 and towards the second word line 150. Accordingly, the second stacked structure ST2 may have the same or similar temperature profile as the first stacked structure ST1.

However, the current in the second variable resistance element 140 may flow from the common bit line 130 toward the second word line 150, i.e. from bottom to top. Therefore, referring to FIG. 3D, when the phase change material forming the second variable resistance layer 147 is crystallized, nucleation may occur at the interface with the second intermediate electrode layer 145, and crystal growth may occur in the direction from bottom to top.

As a result, referring to FIGS. 3C and 3D, the crystallization direction of the phase change material in the second variable resistance layer 147 may be opposite to the temperature increase direction in that layer. Therefore, the crystallization may be relatively slow.

In short, during the set operations of the first and second variable resistance elements 120 and 140, the crystallization of the first variable resistance layer 127 may be relatively fast, but the crystallization of the second variable resistance layer 147 may be relatively slow. Therefore, the first and second variable resistance elements 120 and 140 may have different operation characteristics. For example, during the set operation of changing the phase change material from the amorphous state to the crystalline state, the set operation speed of the first variable resistance element 120 may be higher than the set operation speed of the second variable resistance element 140.

Embodiments can reduce a difference in operation characteristic between the first and second variable resistance elements 120 and 140.

FIGS. 4A and 4B are cross-sectional views illustrating a memory device in accordance with an embodiment, respectively taken along the lines A-A' and B-B' of FIG. 1. In the present embodiment, detailed descriptions of substantially the same components as those of the above-described embodiment will be omitted, and the following descriptions will be focused on differences therebetween.

Referring to FIGS. 4A and 4B, the memory device in accordance with the present embodiment may include a first stacked structure ST1 and a second stacked structure ST2. The first stacked structure ST1 may include a first word line 210 disposed on a substrate 200 and extended in a first direction, for example, a direction parallel to the line A-A', a common bit line 230 extended in a second direction substantially perpendicular to the first word line 210, for example, a direction parallel to the line B-B' over the first word line 210, and a first variable resistance element 220 interposed between the first word line 210 and the common bit line 230 while overlapping an intersection between the first word line 210 and the common bit line 230. The second stacked structure ST2 may include the common bit line 230, a second word line 250 extended in the first direction over the common bit line 230, and a second variable resistance element 240 interposed between the common bit line 230 and the second word line 250 while overlapping an intersection between the common bit line 230 and the second word line 250.

The first variable resistance element 220 includes a first bottom electrode layer 221, a first selection element layer 223, a first intermediate electrode layer 225, a first variable resistance layer 227 and a first top electrode layer 229. The second variable resistance element 240 may include a second bottom electrode layer 241, a second selection element layer 243, a second intermediate electrode layer 245, a second variable resistance layer 247 and a second top electrode layer 249 are stacked. However, the present embodiment is not limited thereto, but at least one of the first bottom electrode layer 221, the first intermediate electrode layer 225 and the first top electrode layer 229 and at least one of the second bottom electrode layer 241, the second intermediate electrode layer 245 and the second top electrode layer 249 may be omitted. Alternatively, one or more layers (not illustrated), for example, a heater material for heating and the like may be further inserted between the first intermediate electrode layer 225 and the first variable resistance layer 227 and between the second intermediate electrode layer 245 and the second variable resistance layer 247, if necessary.

Except for the shapes of the first and second variable resistance layers 227 and 247, the first and second variable resistance elements 220 and 240 may be substantially the same as each other. That is, the first bottom electrode layer 221, the first selection element layer 223, the first intermediate electrode layer 225 and the first top electrode layer 229 may be formed of substantially the same materials as the second bottom electrode layer 241, the second selection element layer 243, the second intermediate electrode layer 245 and the second top electrode layer 249, and have the same layer structures (single-layer or multilayer structures) and shapes as the second bottom electrode layer 241, the second selection element layer 243, the second intermediate electrode layer 245 and the second top electrode layer 249, respectively. The first and second variable resistance layers 227 and 247 may be formed of the same material and have the same layer structure. However, the first and second variable resistance layers 227 and 247 have different shapes, as will be described below in more detail.

In the second direction, both sidewalls of the first variable resistance element 220 may be aligned with the first word line 210, and both sidewalls of the second variable resistance element 240 may be aligned with the second word line 250. Since the first and second word lines 210 and 250 may have the same critical dimension (CD) while substantially overlapping each other, the widths of the first and second variable resistance elements 220 and 240 in the second direction may be equal to each other. That is, the widths of the first and second variable resistance layers 227 and 247 in the second direction may be equal to each other. In the first direction, however, both sidewalls of the first variable resistance element 220 and both sidewalls of the second variable resistance element 240 except the second variable resistance layer 247 may be aligned with the common bit line 230 and have substantially the same CD as the common bit line 230. In the first direction, however, the second variable resistance layer 247 may have a shape whose width decreases from bottom to top, thereby having both sidewalls inclined at an acute angle with respect to the surface of the substrate 200.

As a result, in the first direction, the first variable resistance layer 227 may have a shape whose width is constant from bottom to top, but the second variable resistance layer 247 may have a shape whose width decreases from bottom to top. Therefore, in the first direction, the width 247UW of the upper portion of the second variable resistance layer 247 at a first distance d1 from the common bit line 230 may be smaller than the width 227UW of the upper portion of the first variable resistance layer 227 at the first distance d1 from the first word line 230. Furthermore, the width 247UW of the upper portion of the second variable resistance layer 247 at the first distance d1 from the common bit line 230 may be smaller than a width 247LW of the lower portion of the second variable resistance layer 247 at a second distance d2 from the common bit line 230, the second distance d2 being less than the first distance d1.

Each of the upper portions of the first and second variable resistance layers 227 and 247 may indicate a portion where the height of the corresponding variable resistance layer from the bottom surface thereof is equal to or more than a half of the thickness of the variable resistance layer. In other words, when first heights of the first and second variable resistance layers 227 and 247 from the bottom surfaces thereof are equal to or more than ½ of the thicknesses of the first and second variable resistance layers 227 and 247, respectively, the width of the second variable resistance layer 247 at the first height may be smaller than the width of the first variable resistance layer 227.

In the present embodiment, the case in which the width of the second variable resistance layer 247 is reduced in the first direction has been described. This is because a process of reducing the width of the second variable resistance layer 247 is performed during a process of patterning the second variable resistance layer 247 with the common bit line 230. In another embodiment, however, the width of the second variable resistance layer 247 may be reduced in the second direction or in both of the first and second directions. In any directions, the width of the upper portion of the second variable resistance layer 247 may be smaller than the width of the upper portion of the first variable resistance layer 227.

As indicated by dotted arrows in FIG. 4A, a current in the first variable resistance element 220 may flow from the common bit line 230 toward the first word line 210, i.e. from top to bottom, but a current in the second variable resistance element 240 may flow from the common bit line 230 toward the second word line 250, i.e. from bottom to top. Therefore, when the first and second variable resistance layers 227 and 247 are phase change materials, crystal growth from the interface with the first top electrode layer 229 toward bottom may occur in the first variable resistance layer 227, and crystal growth from the interface with the second intermediate electrode layer 245 toward top may occur in the second variable resistance layer 247.

During a set operation, the main temperature increase direction of the first variable resistance element 220 and the main temperature increase direction of the second variable resistance element 240 may correspond to the direction facing the first selection element layer 223 and the direction facing the second selection element layer 243, respectively, i.e. the direction from top to bottom, and thus coincide with each other. In particular, since the width of the first variable resistance layer 227 is substantially constant depending on the height, the main temperature increase direction may substantially coincide with the temperature increase direction of the first variable resistance layer 227. Since the crystal growth direction and the temperature increase direction in the first variable resistance layer 227 coincide with each other, the first variable resistance layer 227 may be easily crystallized.

However, since the second variable resistance layer 247 has a shape whose width is reduced from bottom to top or specifically whose width is reduced in the first direction, the resistance of the second variable resistance layer 247 may increase from bottom to top. The increase in resistance may result in an increase in the amount of heat generated by the current passing through the second variable resistance layer 247, and result in the increase in temperature. Therefore, although the main temperature increase direction of the second variable resistance element 240 corresponds to the direction from top to bottom, the extent that the temperature of the second variable resistance layer 247 increases from top to bottom may be reduced, or the temperature of the second variable resistance layer 247 may rather increase from bottom to top, due to the tendency that the temperature of the upper portion of the second variable resistance layer 247 increases because of the reduction in width of the upper portion thereof. As a result, the crystallization in the second variable resistance layer 247 may be performed more quickly than in the second variable resistance layer 147 in accordance with the embodiment of FIGS. 2A and 2B. As a result, the operation characteristics of the first and second variable resistance layers 227 and 247, for example, the set operation speeds and the like, may be more similar to each other than in the memory device 20 of FIGS. 4A and 4B than in the memory device of FIGS. 2A and 2B.

FIGS. 5A to 5J are cross-sectional views illustrating a process for fabricating the memory device of FIGS. 4A and 4B. FIG. 6A is a diagram for describing a part of an etch process for forming a first variable resistance element, and FIG. 6B is a diagram for describing a part of an etch process for forming a second variable resistance element.

Figure 5A:
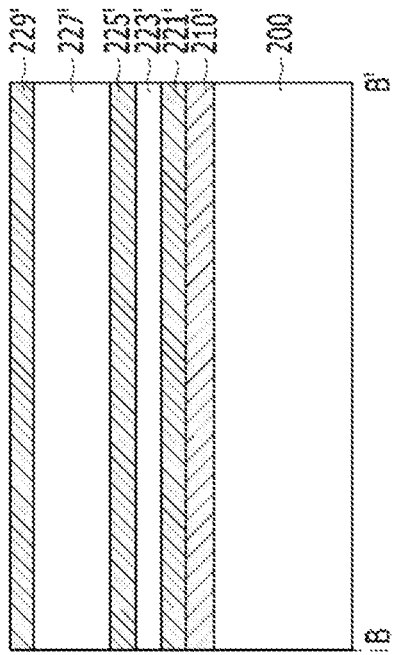
FIGS. 5A to 5J are cross-sectional views illustrating a process for fabricating the memory device of FIGS. 4A and 4B.
Figure 5B:
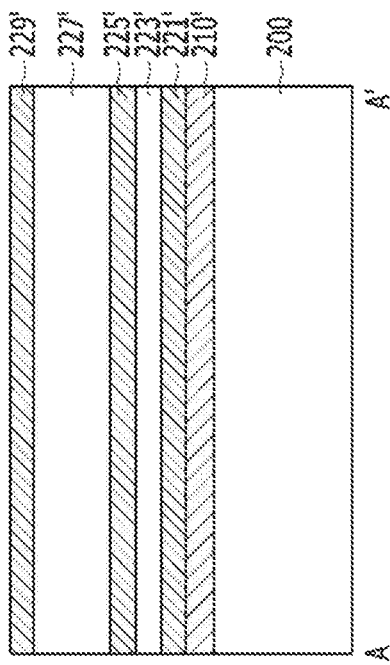
Figure 6A:
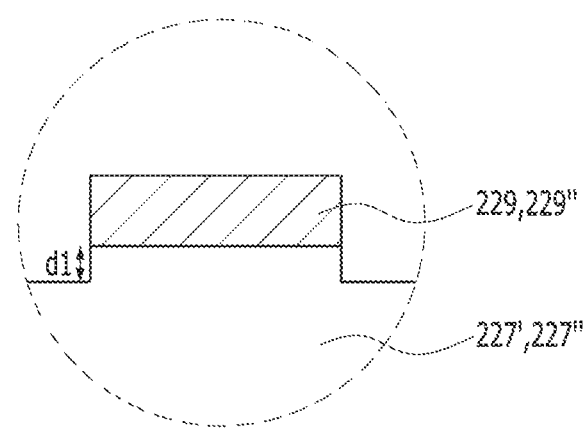
FIG. 6A is a diagram for describing a part of an etch process for forming a first variable resistance element.
Figure 6B:
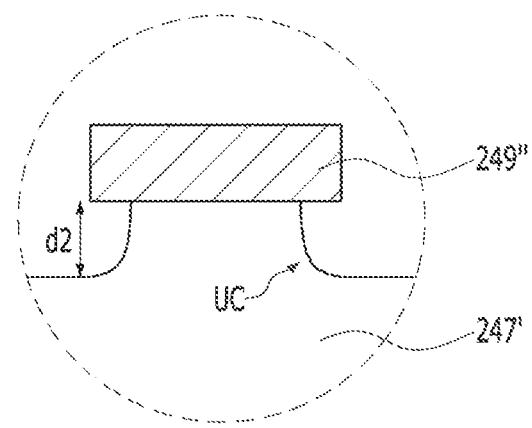
FIG. 6B is a diagram for describing a part of an etch process for forming a second variable resistance element according to an embodiment.

Referring to FIGS. 5A and 5B, a first word line material layer 210', a first bottom electrode material layer 221', a first selection element material layer 223', a first intermediate electrode material layer 225', a first variable resistance material layer 227' and a first top electrode material layer 229' may be formed over the substrate 200.

Figure 5D:
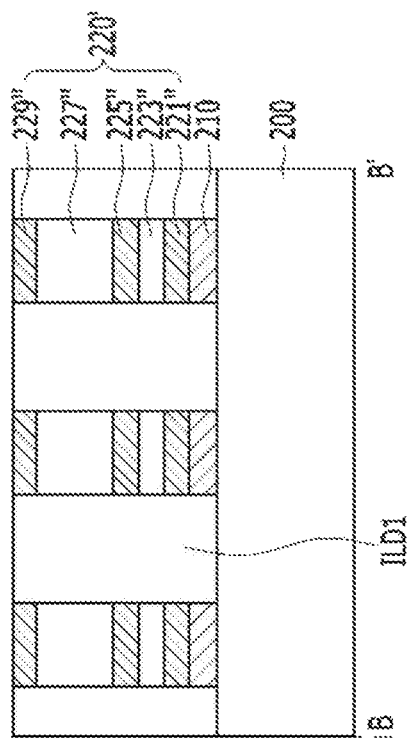
Figure 5C:
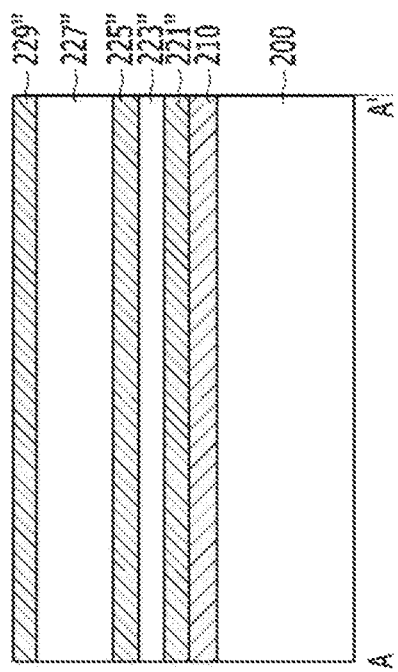

Referring to FIGS. 5C and 5D, a mask pattern (not illustrated) for forming first word lines, e.g. a line-shaped mask pattern extended in the first direction, may be formed on the first top electrode material layer 229', and the material layers 210', 221', 223', 225', 227' and 229' may be etched using the mask pattern as an etch barrier. As a result of this process, the plurality of first word lines 210 may be formed, which are isolated from each other in the second direction while extended in the first direction. Furthermore, line-shaped material layer patterns 221", 223", 225", 227" and 229", which are extended in the first direction while overlapping each of the first word lines 210, may be formed over the first word line 210. The material layer patterns 221", 223", 225", 227" and 229" may be referred to as an initial first variable resistance element 220'.

Then, a first interlayer dielectric layer ILD1 may be disposed between stacked structures each including a first word line 210 and an initial first variable resistance element 220'.

Figure 5E:
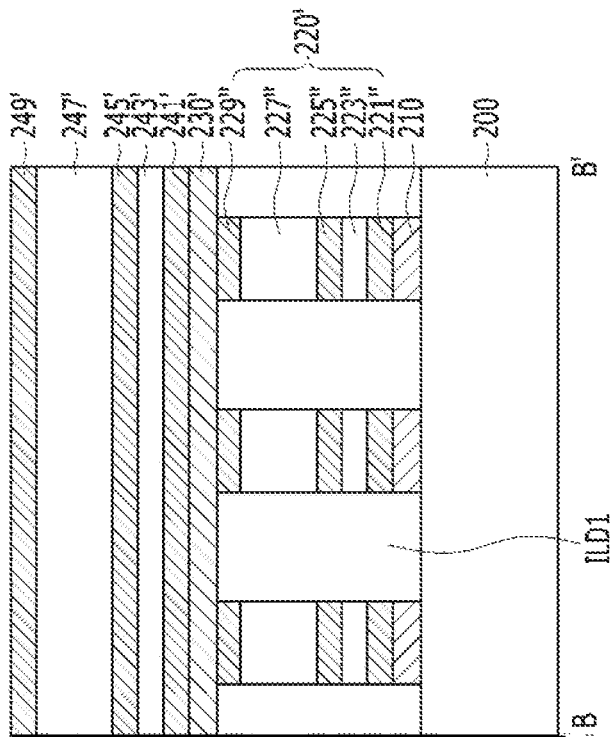
Figure 5F:
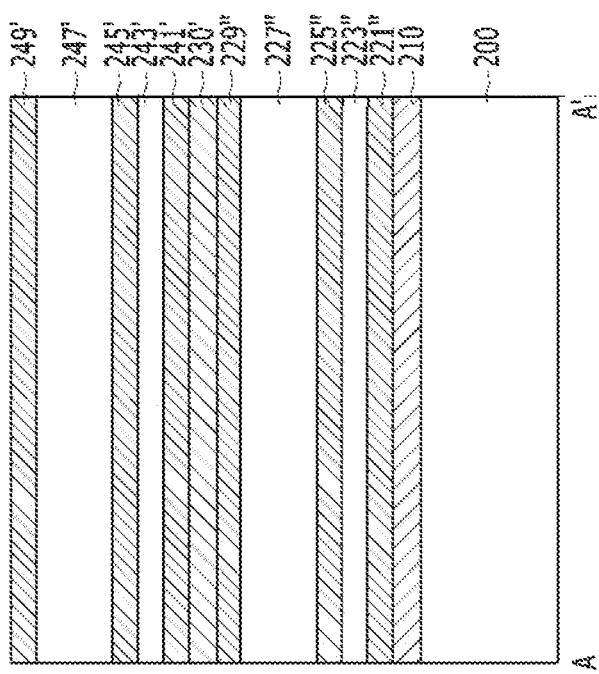

Referring to FIGS. 5E and 5F, a common bit line material layer 230', a second bottom electrode material layer 241', a second selection element material layer 243', a second intermediate electrode material layer 245', a second variable resistance material layer 247' and a second top electrode material layer 249' may be formed over the initial first variable resistance element 220' and the first interlayer dielectric layer ILD1.

Figure 5G:
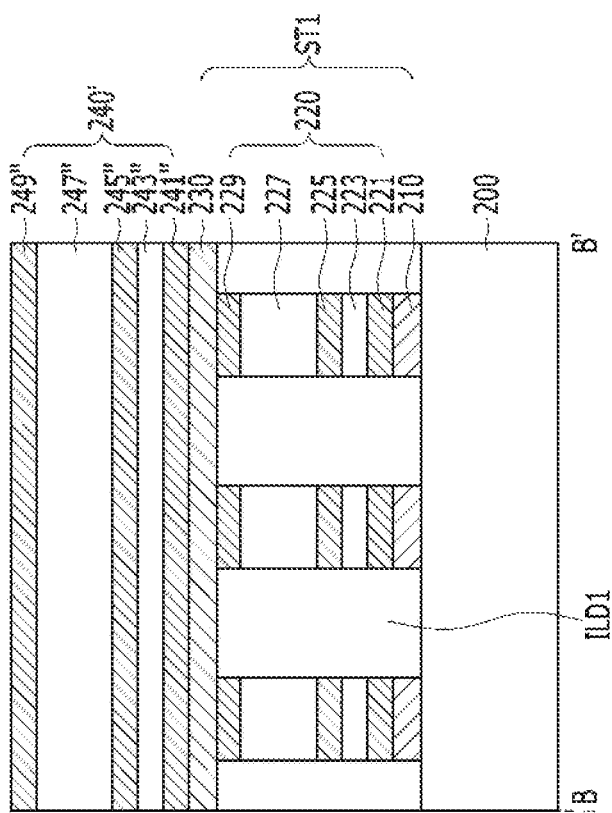
Figure 5H:
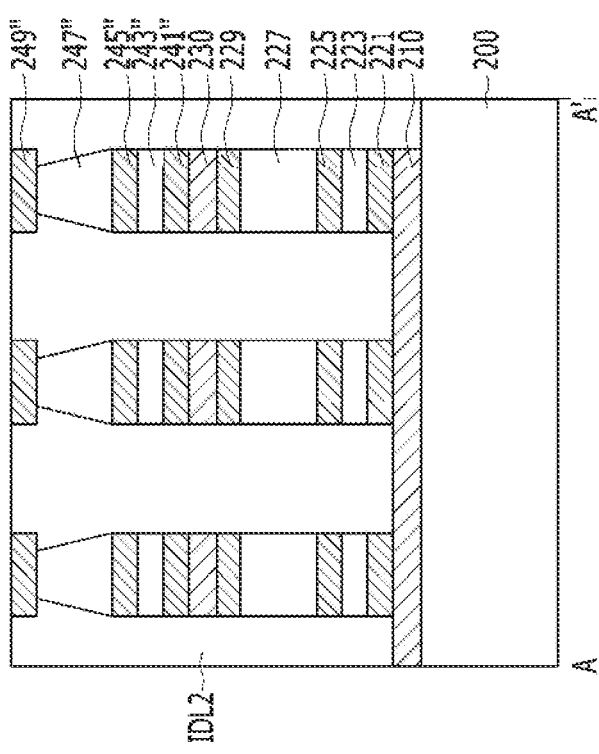

Referring to FIGS. 5G and 5H, a mask pattern (not illustrated) for forming common bit lines, e.g. a line-shaped mask pattern extended in the second direction, may be formed on the second top electrode material layer 249'. Using this mask pattern as an etch barrier, the material layers 230', 241', 243', 245', 247' and 249' may be etched, and the initial first variable resistance element 220' and the first interlayer dielectric layer ILD1, which are exposed by the etching of the material layers 230', 241', 243', 245', 247' and 249', may be etched. As a result of this process, the plurality of common bit lines 230 may be formed, which are isolated from each other in the first direction while extended in the second direction. Furthermore, line-shaped material layer patterns 241", 243", 245", 247" and 249", which are extended in the second direction while overlapping each of the common bit lines 230, may be formed over the common bit line 230. The material layer patterns 241", 243", 245", 247" and 249" may be referred to as an initial second variable resistance element 240'. Under the common bit line 230, the first variable resistance element 220 may be formed by the etching of the initial first variable resistance element 220'. The first variable resistance element 220 may have an island shape in a region overlapping the first word line 210 and the common bit line 230, sidewalls of the first variable resistance element 220 in the second direction may be aligned with the first word line 210, and sidewalls of the first variable resistance element 220 in the first direction may be aligned with the common bit line 230.

During this etch process, the etch condition of the second variable resistance material layer 247' may be adjusted to reduce the width of the upper portion of the second variable resistance material pattern 247" in the first direction.

For example, an etch gas used when an upper portion of the second variable resistance material layer 247' is etched may be different from an etch gas used when a lower portion of the second variable resistance material layer 247' is etched. The etch gas used when the upper portion of the second variable resistance material layer 247' is etched may have a higher anisotropic etch characteristic than the etch gas used when the lower portion of the second variable resistance material layer 247' is etched, so that the upper portion is undercut during the etching of the lower portion. Compared to this, the same type of etch gas may be used when the first variable resistance material layer 227' is etched and/or the first variable resistance material layer pattern 227" is etched.

For another example, a method of performing sufficient over-etch when etching the second top electrode material layer 249' may be used. Compared to this, over-etch may not be performed or less sufficient over-etch may be performed when the first top electrode material layer 229' or the first top electrode material layer pattern 229" is etched. Hereafter, this process will be described in more detail with reference to FIGS. 6A and 6B.

Referring to FIG. 6B, sufficient over-etch may be performed to a second depth d2 when the second top electrode material layer 249' is etched during the etch process for forming the initial second variable resistance element 240' of FIG. 5D. Therefore, an under cut UC may be formed under the second top electrode material layer 249". When the second variable resistance material layer 247' is etched through a subsequent process with the under cut UC formed, the second variable resistance material layer pattern 247" which has the minimum width at the top and whose width increases toward the bottom may be formed because the width of the upper portion of the second variable resistance material layer 247' is already reduced.

Referring to FIG. 6A for comparison, the first top electrode material layer 229' may be over-etched to a first depth d1 smaller than the second depth d2 or hardly over-etched during the etch process for forming the initial first variable resistance element 220' of FIGS. 5C and 5D. Alternatively, during the etch process for forming the first variable resistance element 220 of FIGS. 5G and 5H, the first top electrode material layer pattern 229" may be over-etched to the first depth d1 smaller than the second depth d2 or hardly over-etched. Therefore, under the first top electrode material layer pattern 229" or the first top electrode layer 229, no undercut may be formed, or an undercut smaller than the undercut under the second top electrode material layer pattern 249" may be formed. Therefore, the width of the first variable resistance material layer pattern 227" in the first direction and/or the second direction may be constant, or the first variable resistance material layer pattern 227" may have the minimum width at the top while the width thereof increases toward the bottom. In this case, however, the minimum width may be larger than the minimum width of the second variable resistance material layer pattern 247" in the first direction.

Referring back to FIGS. 5G and 5H, a second interlayer dielectric layer ILD2 may be disposed between the first variable resistance elements 220, between the common bit lines 230 and between the initial second variable resistance elements 240'.

Figure 5J:
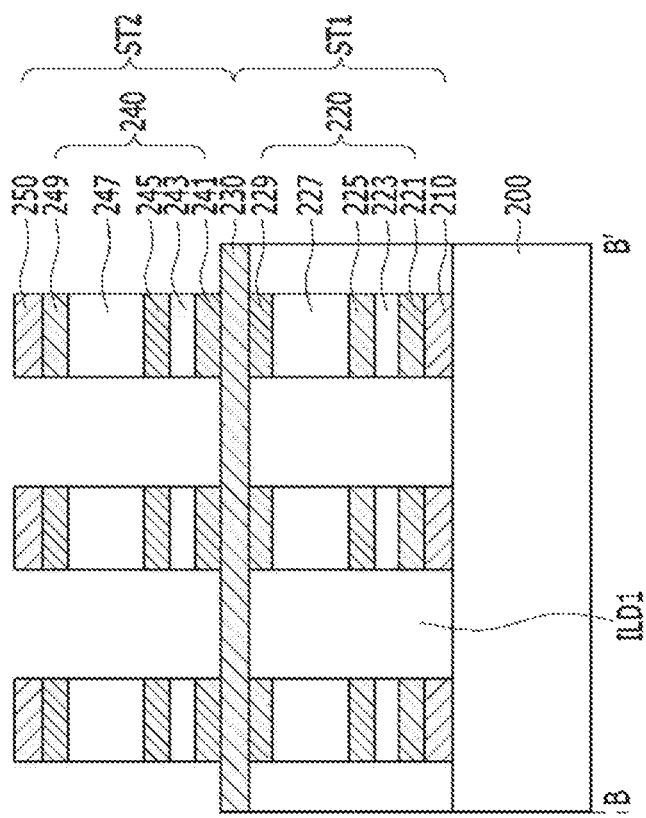
Figure 5I:
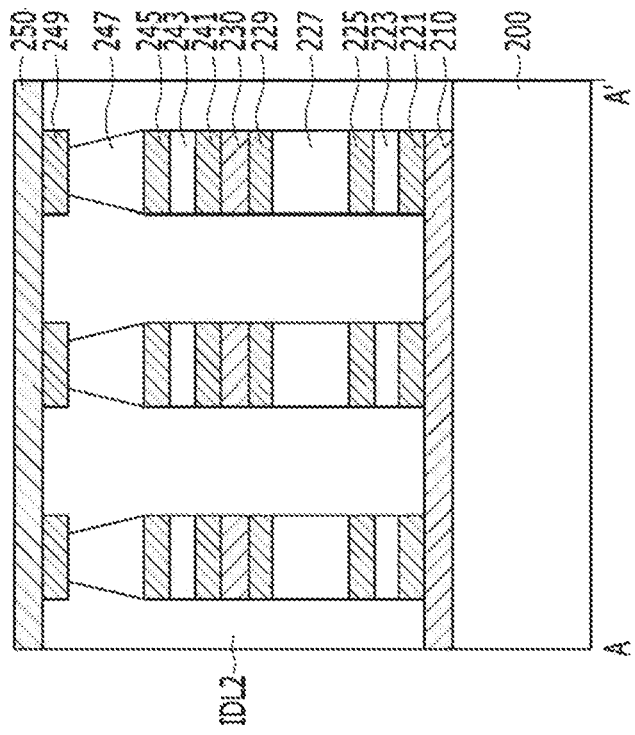

Referring to FIGS. 5I and 5J, a second word line material layer (not illustrated) may be formed over the initial second variable resistance element 240' and the second interlayer dielectric layer ILD2. Then, using a mask pattern (not illustrated) for forming second word lines, that is, a line-shaped mask pattern extended in the first direction, the second word line material layer may be etched, and the initial second variable resistance element 240' and the second interlayer dielectric layer ILD2, which are exposed by the etching of the word line material layer, may be etched. As a result of this process, the plurality of second word lines 250 may be formed, which are isolated from each other in the second direction while extended in the first direction. Furthermore, under the second word line 250, the second variable resistance element 240 may be formed by the etching of the initial second variable resistance element 240'. The second variable resistance element 240 may have an island shape in a region overlapping the second word line 250 and the common bit line 230, both sidewalls of the second variable resistance element 240 in the second direction may be aligned with the second word line 250, and both sidewalls of the second variable resistance element 240 except the second variable resistance layer 247 in the first direction may be aligned with the common bit line 230.

However, the fabrication method may also be modified in various manners. For example, the width of the upper portion of the second variable resistance layer 247 may be reduced through the etch process of FIGS. 5I and 5J, instead of reducing the width of the upper portion of the second variable resistance material layer pattern 247" through the etch process of FIGS. 5G and 5H. For another example, both of the width of the upper portion of the second variable resistance material layer pattern 247" and the width of the upper portion of the second variable resistance layer 247 may be reduced through the etch processes of FIGS. 5G and 5H and FIGS. 5I and 5J.

For another example, after the processes of FIGS. 5A and 5B and FIGS. 5C and 5D are performed, the common bit line material layer 230' may be formed on the resultant structure of the process of FIGS. 5C and 5D and patterned to form the common bit line 230. Then, the initial first variable resistance element 220' and the first interlayer dielectric layer ILD, which are exposed by the common bit line 230, may be etched to form the first variable resistance element 220. The space between the first variable resistance element 220 and the etched first interlayer dielectric layer ILD may be filled with a dielectric material. Thus, the first stacked structure ST1 may be first completed. Then, the material layer patterns 241", 243", 245", 247" and 249" may be formed over the first stacked structure ST1, etched using a mask pattern having the same shape as the mask pattern for forming the common bit line 230, and etched using a mask pattern for forming the second word line 250, thereby forming the second stacked structure ST2. That is, the process of forming the first stacked structure ST1 and the process of forming the second stacked structure ST2 may be separated from each other.

In the above embodiment, it has been described that the sidewalls of the first and second variable resistance elements 220 and 240 except the second variable resistance layer 247 are aligned with the first word line 210, the common bit line 230 and the second word line 250, and the width of the second variable resistance layer 247 gradually decreases from bottom to top in the first direction and/or the second direction such that the uppermost part has the minimum width. However, embodiments are not limited thereto, and may be varied as long as the second variable resistance layer 247 has the minimum width and/or plan size at a specific height of the upper portion thereof (at a portion away from where nucleation and crystal growth begin during a set operation in the second variable resistance layer 247) and the minimum width and/or plan size are smaller than the width and/or plan size of the first variable resistance layer 227 at the corresponding height of the upper portion thereof. The modifications will be described with reference to FIGS. 7A to 7F.

Figure 7A:
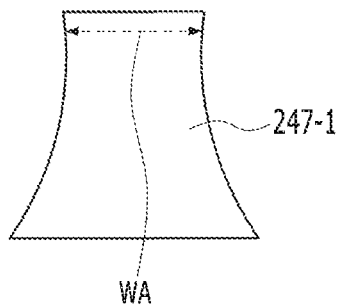
FIGS. 7A to 7C illustrate various cross-sectional shapes of a second variable resistance layer 247 of FIGS. 4A and 4B according to an embodiment.
Figure 7D:
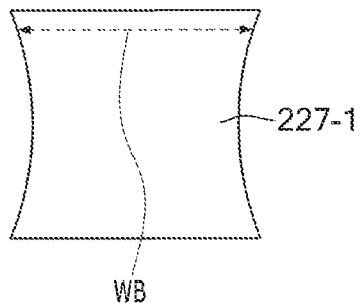
FIGS. 7D to 7F illustrate various modifications of a cross-sectional shape of a first variable resistance layer 227 of FIGS. 4A and 4B, compared to FIGS. 7A to 7C, respectively.
Figure 7B:
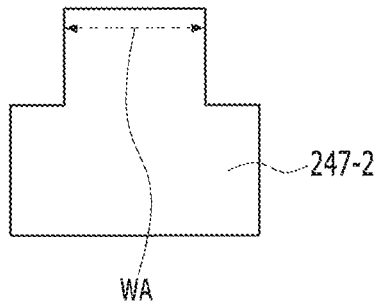
Figure 7E:
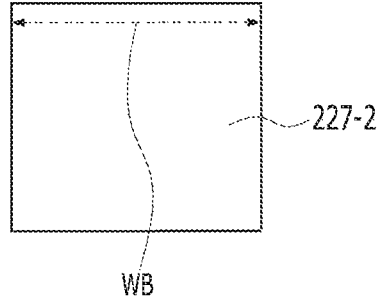
Figure 7C:
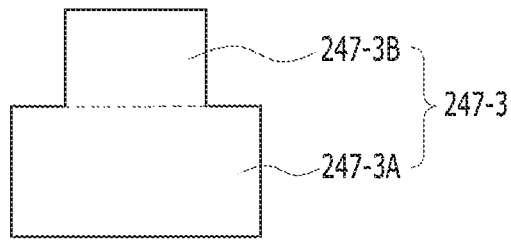
Figure 7F:
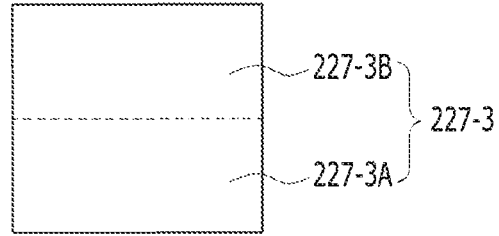

FIGS. 7A to 7C are diagrams illustrating various modifications of the cross-sectional shape of the second variable resistance layer 247. FIGS. 7D to 7F are diagrams illustrating various modifications of the cross-sectional shape of the first variable resistance layer 227, compared to FIGS. 7A to 7C, respectively.

Referring to FIGS. 7A and 7D, at least a part of side surfaces of a second variable resistance layer 247-1 in the first direction and/or the second direction may be formed not in a straight line shape but in a streamlined shape. This structure may be based on the characteristic of the process. Thus, the second variable resistance layer 247-1 may have a minimum width WA not at the uppermost part but at a height slightly lower than the uppermost part. At the corresponding height, the width WB of a first variable resistance layer 227-1 may be larger than the minimum width WA of the second variable resistance layer 247-1, and thus a cross-sectional area of the second variable resistance layer 247-1 at that height may be smaller than the corresponding cross-sectional area of the first variable resistance layer 227-1.

Referring to FIGS. 7B and 7E, side surfaces of a second variable resistance layer 247-2 in the first direction and/or the second direction may have a stair shape. In the present embodiment, FIG. 7B illustrates that the side surfaces of the second variable resistance layer 247-2 have a stair shape in two stages. However, the side surfaces of the second variable resistance layer 247-2 may have a stair shape in three or more stages. This structure may be based on the characteristic of the process. Even in this case, the upper stair of the second variable resistance layer 247-2 may have a smaller width than the lower stair thereof. When the second variable resistance layer 247-2 has a stair shape in three or more stages, the widths of the stairs may decrease toward the top. However, a first variable resistance layer 227-2 may have a substantially constant width.

Referring to FIG. 7C and 7F, a second variable resistance layer 247-3 may have a stacked structure of first and second layers 247-3A and 247-3B, and the first layer 247-3A may have a greater width than the second layer 247-3B. The first and second layers 247-3A and 247-3B may be formed of different materials. For example, although the first and second layers 247-3A and 247-3B are formed of phase change materials, the types or chemical composition ratios of elements composing the respective layers and the types of impurities implanted into the respective layers may be different from each other. In particular, under the same etch condition, the first layer 247-3A may be formed of a material having a higher anisotropic etch characteristic than the second layer 247-3B. In the present embodiment, FIG. 7C illustrates that the second variable resistance layer 247-3 has two layers. However, the second variable resistance layer 247-3 may have three or more layers. On the other hand, a first variable resistance layer 227-3 may also have a stacked structure of first and second layers 227-3A and 227-3B, but the first and second layers 227-3A and 227-3B may have substantially the same width.

Figure 8A:
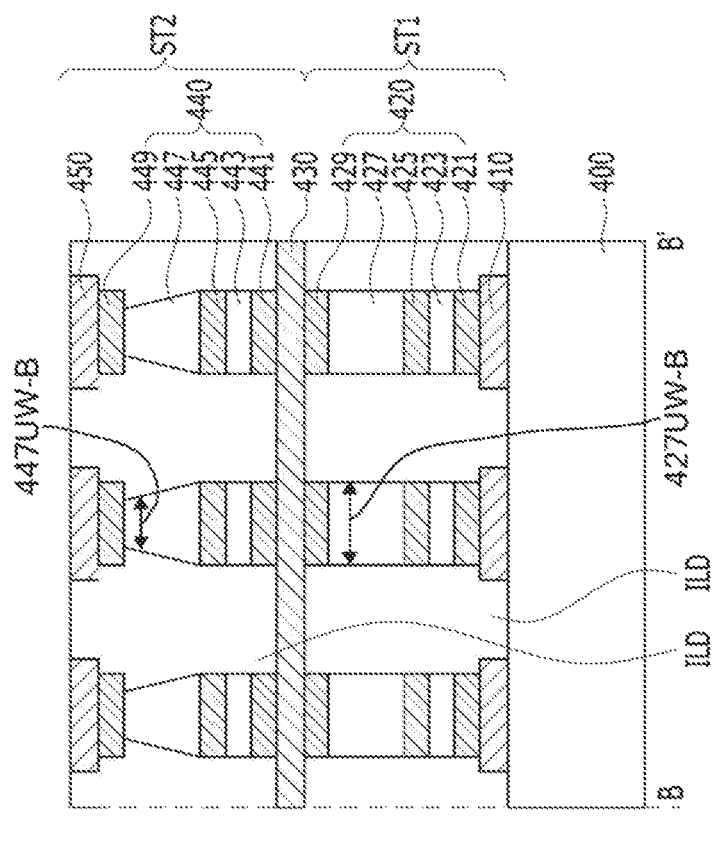
FIGS. 8A and 8B are cross-sectional views illustrating a memory device in accordance with an embodiment, respectively taken along the lines A-A' and B-B' of FIG. 1.
Figure 8B:
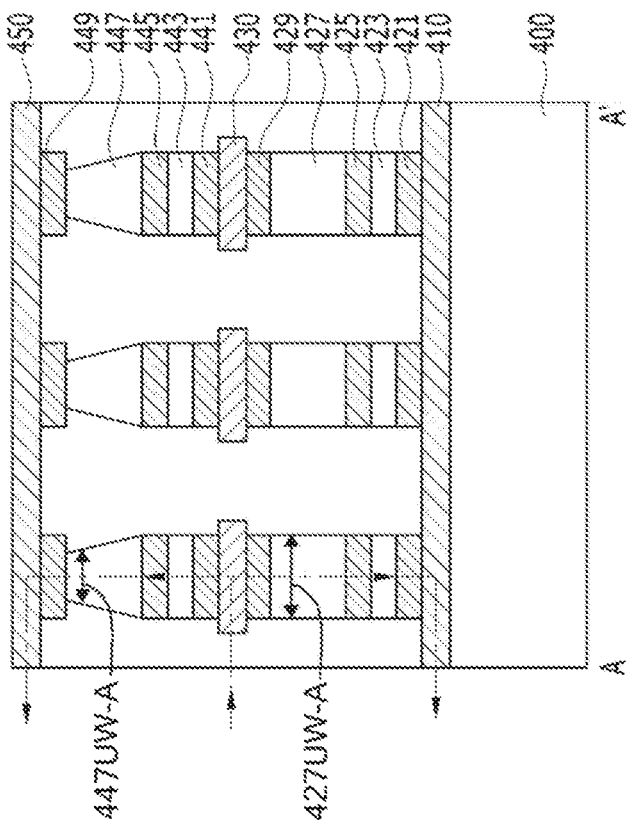

FIGS. 8A and 8B are cross-sectional views illustrating a memory device 30 in accordance with an embodiment, respectively taken along the lines A-A' and B-B' of FIG. 1.

Referring to FIGS. 8A and 8B, the memory device 30 in accordance with the present embodiment may include a first stacked structure ST1 and a second stacked structure ST2. The first stacked structure ST1 may include a first word line 410 disposed on a substrate 400 and extended in a first direction, for example, a direction parallel to the line A-A', a common bit line 430 extended in a second direction substantially perpendicular to the first word line 410, for example, a direction parallel to the line B-B' over the first word line 410, and a first variable resistance element 420 interposed between the first word line 410 and the common bit line 430 while overlapping an intersection between the first word line 410 and the common bit line 430, and the second stacked structure ST2 may include the common bit line 430, a second word line 450 extended in the first direction over the common bit line 430, and a second variable resistance element 440 interposed between the common bit line 430 and the second word line 450 while overlapping an intersection between the common bit line 430 and the second word line 450. Elements of the variable resistance elements 420 and 440 having reference characters 421, 423, 425, 429 and 441, 443, 445, 449 correspond to elements of the variable resistance elements 220 and 240 of FIGS. 4A and 4B having reference characters 221, 223, 225, 229 and 241, 243, 245, 249, respectively, and therefore descriptions thereof are omitted in the interest of brevity.

The first variable resistance element 420 may not have sidewalls aligned with the first word line 410 and the common bit line 430. That is because the first variable resistance element 420 is patterned separately from the first word line 410 and the common bit line 430. For example, the patterning of the first variable resistance element 420 may be performed through an island-shaped mask pattern (not illustrated). Thus, the first variable resistance element 420 may have a cylindrical shape or a similar shape to the cylindrical shape. Similarly, the second variable resistance element 440 may not have sidewalls aligned with the common bit line 430 and the second word line 450.

A second variable resistance layer 447 of the second variable resistance element 440 may have a cylindrical shape whose width decreases from bottom to top. That is, the sidewalls of the second variable resistance layer 447 may be inclined in all directions. Accordingly, a first upper width 447UW-A along line A-A' and a second upper width 447UW-B along line B-B of the second variable resistance layer 447 may be respectively smaller than a third upper width 447UW-A along line A-A' and a fourth upper width 427UW-B along line B-B of the first variable resistance layer 427.

Figure 9A:
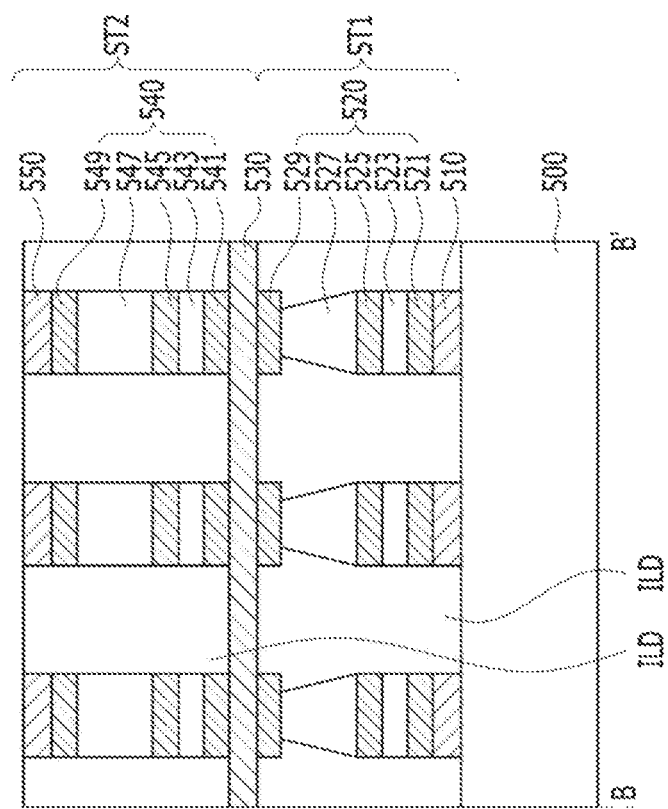
FIGS. 9A and 9B are cross-sectional views illustrating a memory device in accordance with an embodiment, respectively taken along the lines A-A' and B-B' of FIG. 1.
Figure 9B:
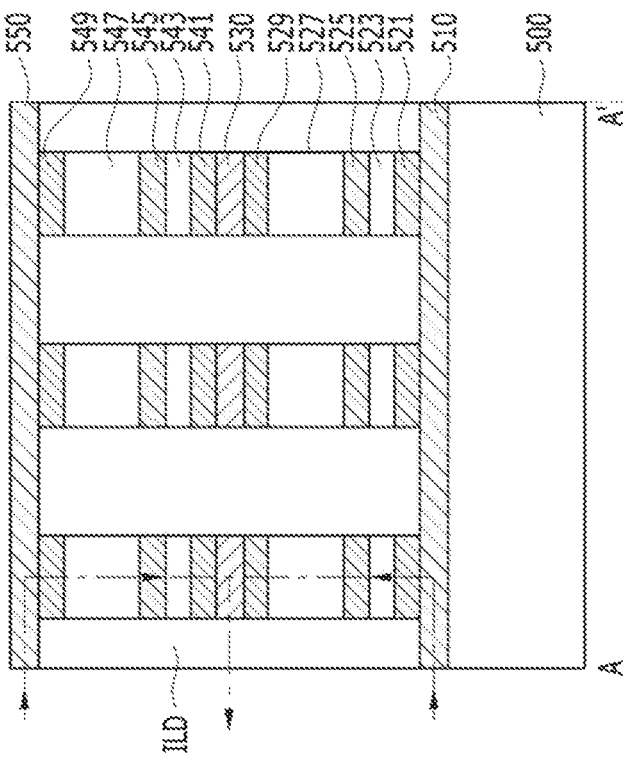

FIGS. 9A and 9B are cross-sectional views illustrating a memory device 40 in accordance with an embodiment, respectively taken along the lines A-A' and B-B' of FIG. 1. In the present embodiment, the direction of a current flowing through the memory device 40 may be opposite to the direction of the current flowing through the memory devices 20 and 30 in the above-described embodiments.

Referring to FIGS. 9A and 9B, the memory device 40 in accordance with the present embodiment may include a first stacked structure ST1 and a second stacked structure ST2. The first stacked structure ST1 may include a first word line 510 disposed on a substrate 500 and extended in a first direction, for example, a direction parallel to the line A-A', a common bit line 530 extended in a second direction substantially perpendicular to the first word line 510, for example, a direction parallel to the line B-B' over the first word line 510, and a first variable resistance element 520 interposed between the first word line 510 and the common bit line 530 while overlapping an intersection between the first word line 510 and the common bit line 530, and the second stacked structure ST2 may include the common bit line 530, a second word line 550 extended in the first direction over the common bit line 530, and a second variable resistance element 540 interposed between the common bit line 530 and the second word line 550 while overlapping an intersection between the common bit line 530 and the second word line 550. Elements of the variable resistance elements 520 and 540 having reference characters 521, 523, 525, 529 and 541, 543, 545, 549 correspond to elements of the variable resistance elements 220 and 240 of FIGS. 4A and 4B having reference characters 221, 223, 225, 229 and 241, 243, 245, 249, respectively, and descriptions thereof are therefore omitted in the interest of brevity.

Unlike the above-described embodiments, the width of a first variable resistance layer 527 of the first variable resistance element 520 may decrease from bottom to top, for the following reasons.

As indicated by dotted arrows in FIG. 9A, a current in the first variable resistance element 520 may flow from the first word line 510 toward the common bit line 530, that is, from bottom to top, but a current in the second variable resistance element 540 may flow from the second word line 550 toward the common bit line 530, that is, from top to bottom. Therefore, when the first and second variable resistance layers 527 and 547 are phase change materials, crystal growth in the first variable resistance layer 527 may proceed from the interface with a first intermediate electrode layer 525 toward the top, and crystal growth in the second variable resistance layer 547 may proceed from the interface with a second top electrode layer 549 toward the bottom.

As in the previous embodiments, the temperature of the second variable resistance layer 547 may increase in the direction towards the second selection element layer 543. Since the crystal growth direction and the temperature increase direction of the second variable resistance layer 547 coincide with each other, the second variable resistance layer 547 may be more easily crystallized.

However, since the first variable resistance layer 527 has a shape whose width decreases from bottom to top or specifically in the second direction, the resistance of the first variable resistance layer 527 may increase from bottom to top. The increase in resistance in the regions near the first top electrode layer 529 may cause an increase in temperature in those regions. As a result, the rate at which the temperature of the first variable resistance layer 527 increases from top to bottom may be reduced, or the temperature of the first variable resistance layer 527 may be caused to increase from bottom to top. As a result, the shape of the first variable resistance layer 527 may cause the temperature decrease in the crystal growth direction to be reduced, or may cause the temperate to increase in the crystal growth direction, thus making crystallization of the first variable resistance layer 527 easier.

FIGS. 10A and 10B are cross-sectional views illustrating a memory device 50 in accordance with an embodiment, respectively taken along the lines A-A' and B-B' of FIG. 1. In the present embodiment, layers constituting a variable resistance element may be stacked in the opposite direction of the above-described embodiments. That is, a selection element layer may be positioned over a variable resistance layer.

Referring to FIGS. 10A and 10B, the memory device 50 in accordance with the present embodiment may include a first stacked structure ST1 and a second stacked structure ST2. The first stacked structure ST1 may include a first word line 610 disposed on a substrate 600 and extended in a first direction, for example, a direction parallel to the line A-A', a common bit line 630 extended in a second direction substantially perpendicular to the first word line 610, for example, a direction parallel to the line B-B' over the first word line 610, and a first variable resistance element 620 interposed between the first word line 610 and the common bit line 630 while overlapping an intersection between the first word line 610 and the common bit line 630, and the second stacked structure ST2 may include the common bit line 630, a second word line 650 extended in the first direction over the common bit line 630, and a second variable resistance element 640 interposed between the common bit line 630 and the second word line 650 while overlapping an intersection between the common bit line 630 and the second word line 650.

The width of a first variable resistance layer 623 may decrease from top to bottom. Thus, the first variable resistance layer 623 may have the minimum width at the bottom thereof. However, a second variable resistance layer 643 may have a substantially constant width which is larger than the width of the lower portion of the first variable resistance layer 623.

Unlike the above-described embodiments, the first variable resistance element 620 may include a stacked structure of a first bottom electrode layer 621, the first variable resistance layer 623, a first intermediate electrode layer 625, a first selection element layer 627 and a first top electrode layer 629. That is, the first selection element layer 627 may be disposed over the first variable resistance layer 623. Similarly, the second variable resistance element 640 may include a stacked structure of a second bottom electrode layer 641, a second variable resistance layer 643, the second intermediate electrode layer 645, a second selection element layer 647 and a second top electrode layer 649, with the second selection element layer 647 may be disposed over the second variable resistance layer 643. In this case, the temperature increase direction of the first variable resistance layer 623 and the temperature increase direction of the second variable resistance layer 643 may correspond to the direction facing the first selection element layer 627 and the direction facing the second selection element layer 647, respectively, i.e. bottom to top, unlike embodiments of FIGS. 4A and 4B, FIGS. 8A and 8B, and FIGS. 9A and 9B.

As indicated by dotted arrows in FIG. 10A, a current in the first variable resistance element 620 may flow from top to bottom, but a current in the second variable resistance element 640 may flow from bottom to top.

Since the width of the second variable resistance layer 643 is substantially constant along the height thereof, the temperature increase direction thereof may be towards the second selection element layer 647, and may therefore coincide with the crystal growth direction in the second variable resistance layer 643. As a result, the second variable resistance layer 643 may be easily crystallized. However, since the width of the first variable resistance layer 623 decreases from top to bottom, resistance thereof may increase from top to bottom. Therefore, because additional heat will be generated by the current flowing through the higher-resistance bottom portions of the first variable resistance layer 623, the heat generation from the first selection element layer 627 may be counter-balanced or negated, the extent that the temperature of the first variable resistance layer 623 decreases less from top to bottom or the increases from top to bottom, due to additional heat generated in the lower portion of the first variable resistance layer 623. As a result, the crystal growth direction and the temperature increase direction in at least the first variable resistance layer 623 may coincide with each other or became closer to coinciding with each other, thus making crystallization of the first variable resistance layer 623 easier.

Each of the lower portions of the first and second variable resistance layers 623 and 643 may indicate a portion where the height of the corresponding variable resistance layer from the top surface thereof is equal to or more than a half of the thickness of the variable resistance layer. In other words, when first distances from the top surfaces of the first and second variable resistance layers 623 and 643 are equal to or more than ½ of the thicknesses of the first and second variable resistance layers 623 and 643, respectively, the width 623W of the first variable resistance layer 623 at the first distance may be smaller than the width 643W of the second variable resistance layer 643.

Figure 11B:
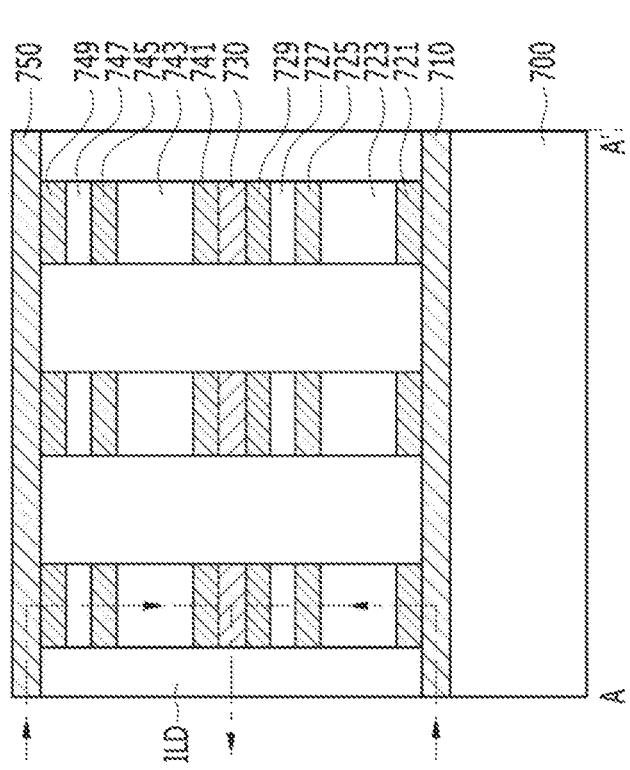
FIGS. 11A and 11B are cross-sectional views illustrating a memory device in accordance with an embodiment, respectively taken along the lines A-A' and B-B' of FIG. 1.
Figure 11A:
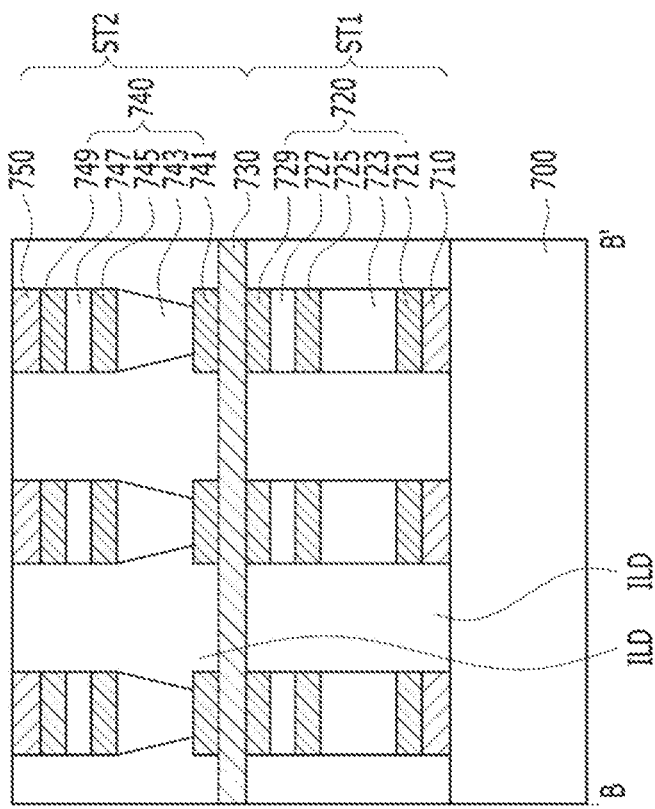

FIGS. 11A and 11B are cross-sectional views illustrating a memory device 60 in accordance with an embodiment, respectively taken along the lines A-A' and B-B' of FIG. 1. In the present embodiment, the memory device 60 may have the same general structure as the embodiment of FIGS. 10A and 10B, but the direction of a current in the memory device 60 may be opposite to that of the embodiment of FIGS. 10A and 10B.

Referring to FIGS. 11A and 11B, the memory device 60 in accordance with the present embodiment may include a first stacked structure ST1 and a second stacked structure ST2. The first stacked structure ST1 may include a first word line 710 disposed on a substrate 700 and extended in a first direction, for example, a direction parallel to the line A-A', a common bit line 730 extended in a second direction substantially perpendicular to the first word line 710, for example, a direction parallel to line B-B' over the first word line 710, and a first variable resistance element 720 interposed between the first word line 710 and the common bit line 730 while overlapping an intersection between the first word line 710 and the common bit line 730, and the second stacked structure ST2 may include the common bit line 730, a second word line 750 extended in the first direction over the common bit line 730, and a second variable resistance element 740 interposed between the common bit line 730 and the second word line 750 while overlapping an intersection between the common bit line 730 and the second word line 750. Elements of the variable resistance elements 720 and 740 having reference characters 721, 725, 727, 729 and 741, 745, 747, 749 correspond to elements of the variable resistance elements 620 and 640 of FIGS. 10A and 10B having reference characters 621, 625, 627, 629 and 641, 645, 647, 649, respectively, and descriptions thereof are therefore omitted in the interest of brevity.

The width of a second variable resistance layer 743 may decrease from top to bottom. Thus, the second variable resistance layer 743 may have the minimum width at the bottom thereof. However, a first variable resistance layer 723 may have a substantially constant width which is larger than the bottom width of the second variable resistance layer 743.

The main temperature increase direction of the first variable resistance element 720 and the main temperature increase direction of the second variable resistance element 740 may correspond to the direction facing a first selection element layer 727 and the direction facing a second selection element layer 747, respectively, i.e. the direction from bottom to top.

As indicated by dotted arrows in FIG. 11A, a current in the first variable resistance element 720 may flow from bottom to top, but a current in the second variable resistance element 740 may flow from top to bottom.

The temperature increase direction and the current flow direction in the first variable resistance layer 723 may coincide with each other. However, to reduce or eliminate a difference in the temperature increase direction and the current flow direction in the second variable resistance layer 743, the width of a bottom region of the second variable resistance layer 743 may be reduced to increase the resistance (and therefore the temperature) thereof, thereby promoting crystal growth in the second variable resistance layer 743.

In the above-described embodiments, it has been described that the two stacked structures ST1 and ST2 are stacked in a direction perpendicular to the substrate surface. However, three or more stacked structures may be stacked. In this case, variable resistance layers in the plurality of stacked structures may alternately have the same shape. That is, the variable resistance layers in an odd-numbered stacked structure may have the same first shape, and the variable resistance layers in an even-numbered stacked structure may have the same second shape that is different from the first shape. Hereafter, referring to FIGS. 12A and 12B, the structure will be described.

Figure 12A:
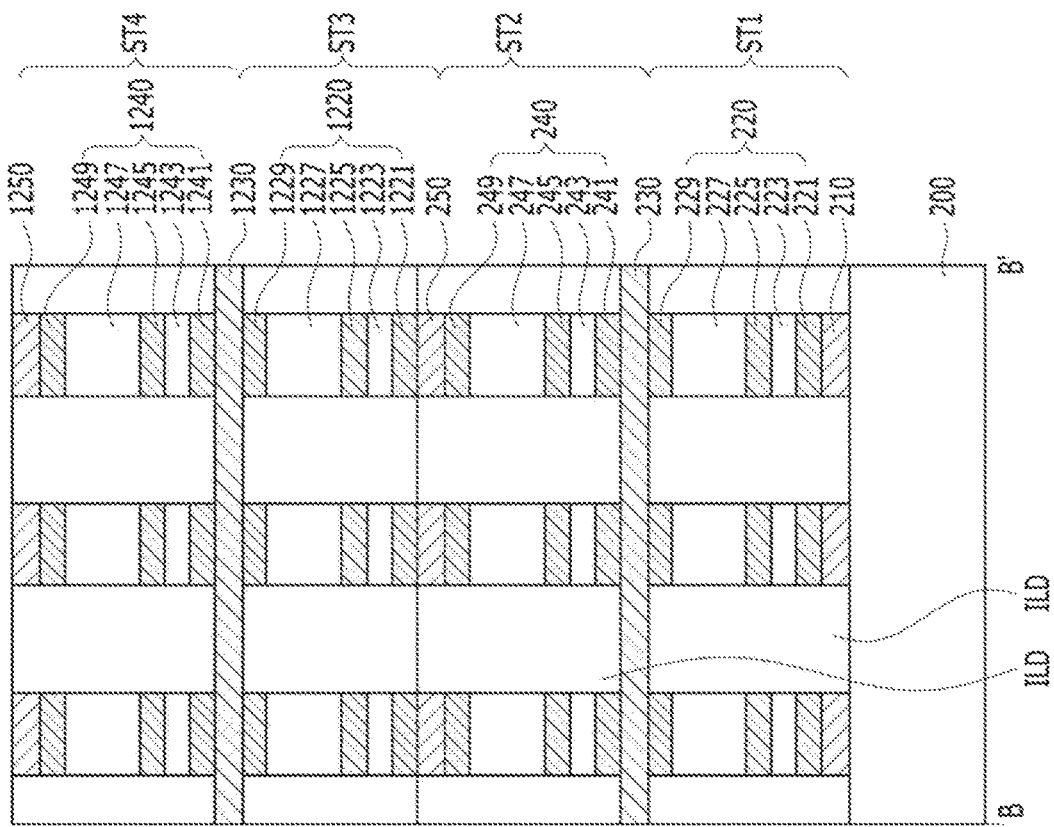
FIGS. 12A and 12B are cross-sectional views illustrating a memory device in accordance with an embodiment.
Figure 12B:
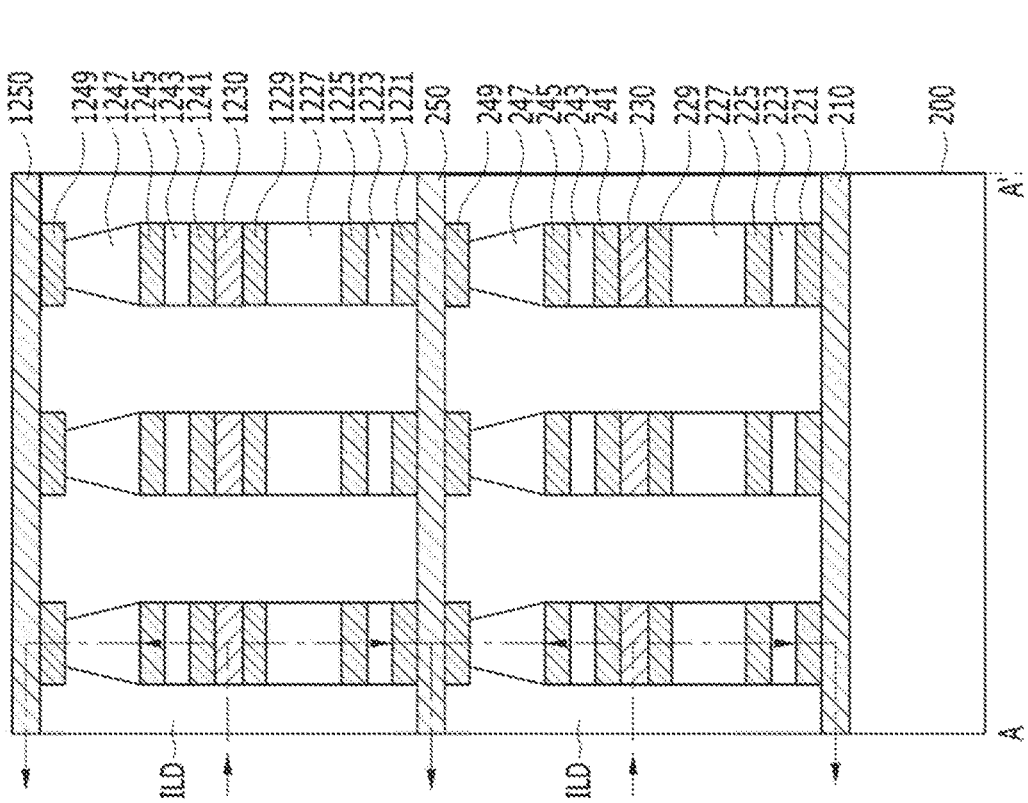

FIGS. 12A and 12B are cross-sectional view illustrating a memory device 70 in accordance with an embodiment, showing the case in which four stacked structures are stacked in a vertical direction.

Referring to FIGS. 12A and 12B, first and second stacked structures ST1 and ST2 having substantially the same structure as those described with reference to FIGS. 4A and 4B may be formed over a substrate 100.

A third stacked structure ST3 may be formed on the second stacked structure ST2, and may be similar to the first stacked structure ST1. A fourth stacked structure ST4 may be formed on the third stacked structure ST3, and may be similar to the second stacked structure ST2. Therefore elements of the third and fourth stacked structures ST3 and ST4 having reference characters 1220, 1221, 1223, 1225, 1227, 1229, 1230, 1240, 1241, 1243, 1245, 1247, 1249, and 1250 correspond to elements of the first and second stacked structures ST1 and ST2 having reference characters 220, 221, 223, 225, 227, 1229, 230, 240, 241, 243, 245, 247, 249, and 250, respectively, and descriptions thereof are omitted in the interest of brevity.

In accordance with the present embodiments, the electronic device can improve the operation characteristics by reducing a difference between operational characteristics of memory cells on different layers.

The above and other memory circuits or semiconductor devices based on the disclosed technology can be used in a range of devices or systems. FIGS. 13-17 provide some examples of devices or systems that can implement the memory circuits disclosed herein.

Figure 13:
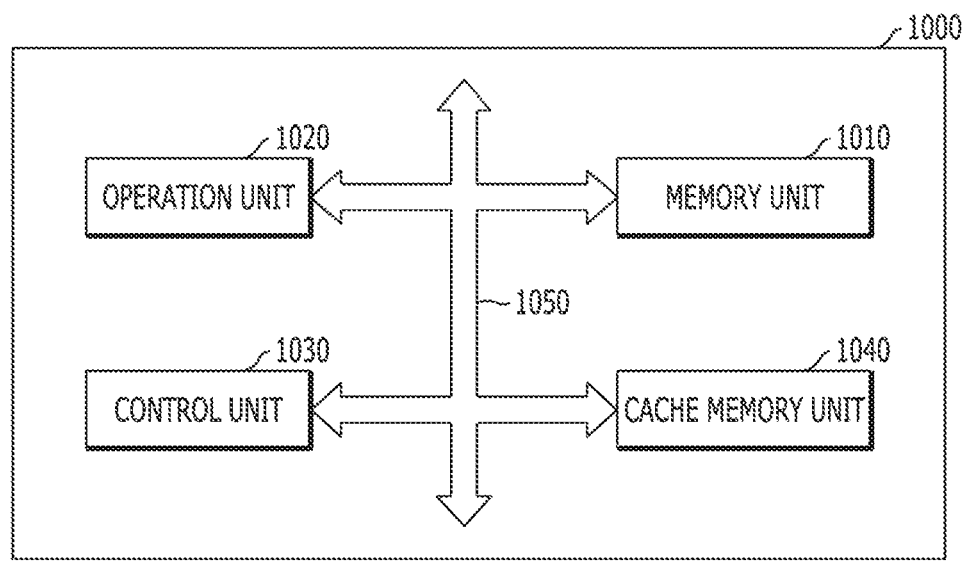
FIG. 13 illustrates a microprocessor implementing memory circuitry based on the disclosed technology.

FIG. 13 is an example of configuration diagram of a microprocessor implementing memory circuitry based on the disclosed technology.

Referring to FIG. 13, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with embodiments of the present disclosure such as described with respect to FIGS. 4A and 4B and FIGS. 8A-12B. Through this, operating characteristics of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 14:
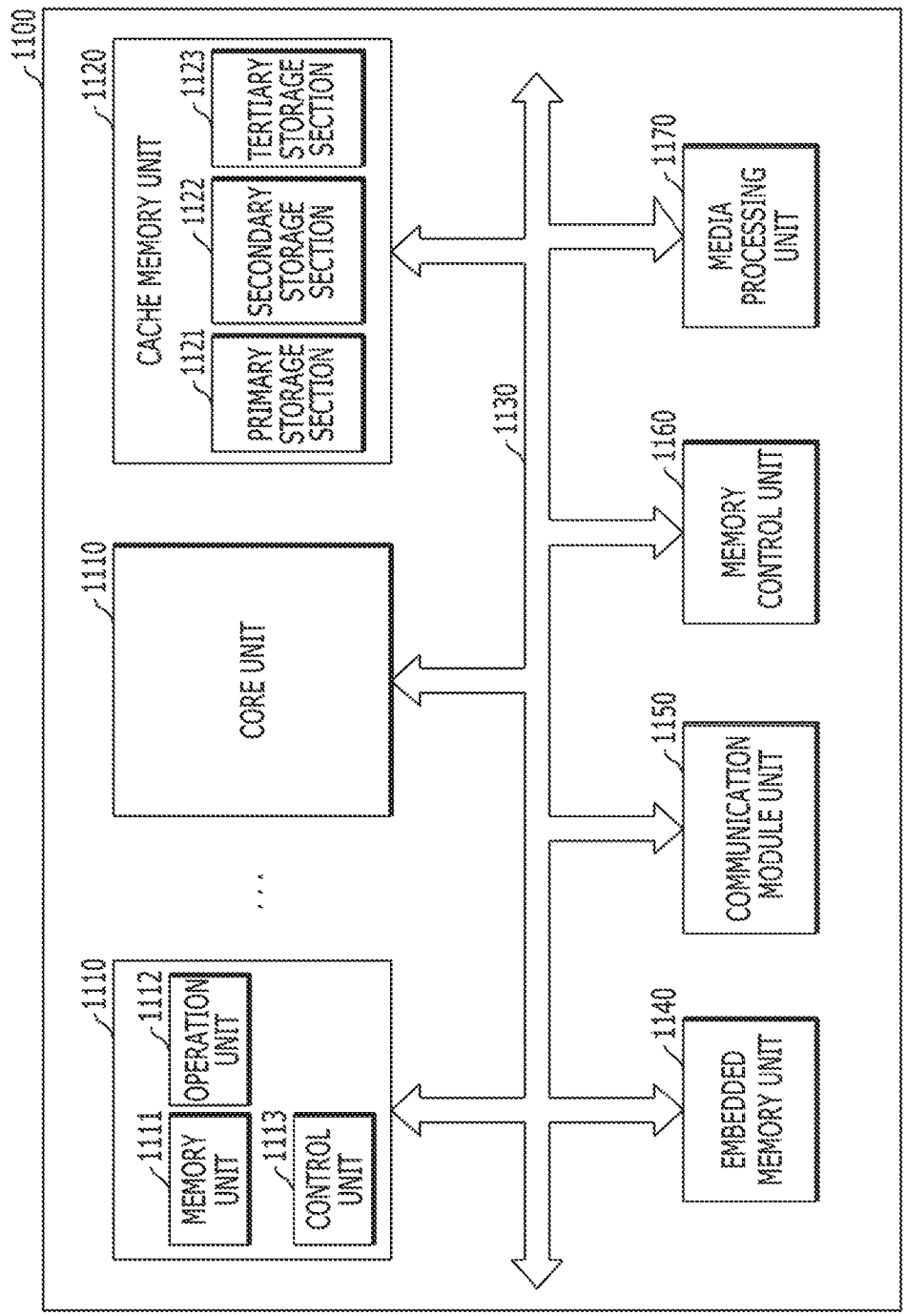
FIG. 14 illustrates a processor implementing memory circuitry based on the disclosed technology.

FIG. 14 is an example of configuration diagram of a processor implementing memory circuitry based on the disclosed technology.

Referring to FIG. 14, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 performs data operations in the processor 1100. The operation unit 1112 may perform arithmetical and logical operations, and the like, according to results of the control unit 1113 decoding commands. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 temporarily stores data to compensate for a difference in data processing speed between the core unit 1110 operating at a high speed and an external device operating at a lower speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 where high storage capacity is required. The number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be highest. At least one storage section of the primary storage section 1121, the secondary storage section 1122 and the tertiary storage section 1123 of the cache memory unit 1120 may include one or more of semiconductor devices in accordance with the embodiments described with respect to FIGS. 4A and 4B and FIGS. 8A-12B of the present disclosure. Through this, operating characteristics of the cache memory unit 1120 may be improved. As a consequence, operating characteristics of the processor 1100 may be improved.

Although it was shown in FIG. 14 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), or a memory with similar functions.

The communication module unit 1150 may include a module capable of being connected with a wired network, a module capable of being connected with a wireless network, or both. The wired network module may include a local area network (LAN), a universal serial bus (USB), and so on. The wireless network module may include Infrared Data Association (IrDA), a wireless LAN, Zigbee, a ubiquitous sensor network (USN), Bluetooth, radio frequency identification (RFID), long term evolution (LTE), near field communication (NFC), a wireless broadband Internet (Wibro), and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB, a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 15:
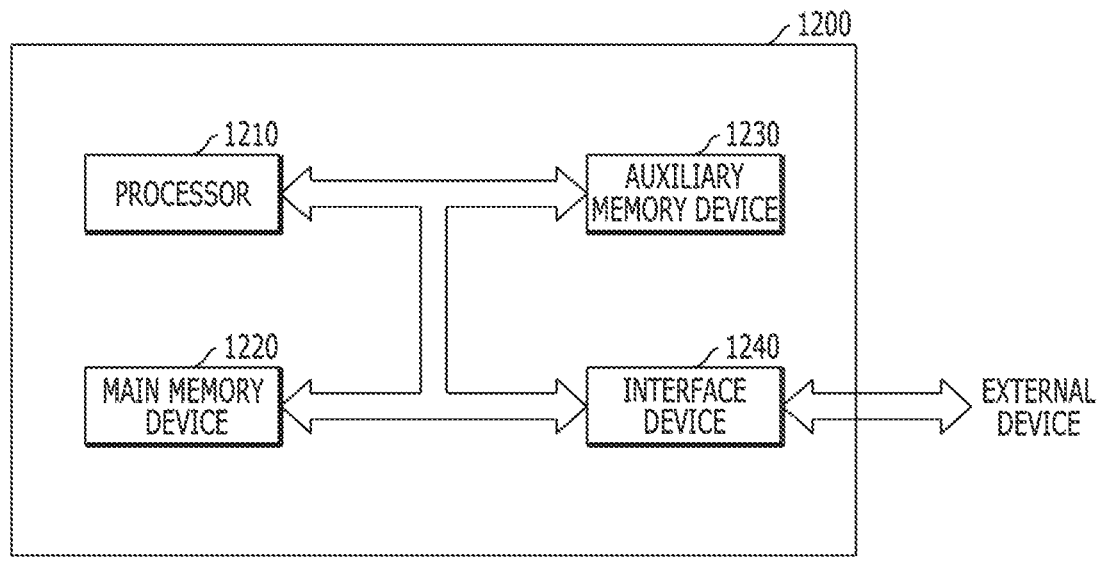
FIG. 15 illustrates a system implementing memory circuitry based on the disclosed technology.

FIG. 15 is an example of configuration diagram of a system implementing memory circuitry based on the disclosed technology.

Referring to FIG. 15, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a portable computer, a tablet, a wireless phone, a mobile phone, a smart phone, a digital music player, a PMP (portable multimedia player), a camera, a global positioning system (GPS), a video camera, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the embodiments described with respect to FIGS. 4A and 4B and FIGS. 8A-12B. Through this, operating characteristics of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type. In some cases, the main memory device 1220 may not include the semiconductor devices according to embodiments of the present disclosure, but may include a static random access memory (SRAM), a dynamic random access memory (DRAM), and so on, of a volatile memory type.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device

1230 may include one or more of the above-described semiconductor devices in accordance with embodiments of the present disclosure such as described with respect to FIGS. 4A and 4B and FIGS. 8A-12B. Through this, operating characteristics of the auxiliary memory device 1230 may be improved. As a consequence, operating characteristics of the system 1200 may be improved.

Also, the auxiliary memory device 1230 may further include a data storage system (see the reference numeral 1300 of FIG. 16) such as a magnetic tape, a magnetic disk, a laser disk, a magneto-optical disc, a solid state disk (SSD), a USB memory, an SD card, a micro SD card, an SDHC card, a memory stick, an SM card, an MMC card, an eMMC, a CF card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them.

Figure 16:
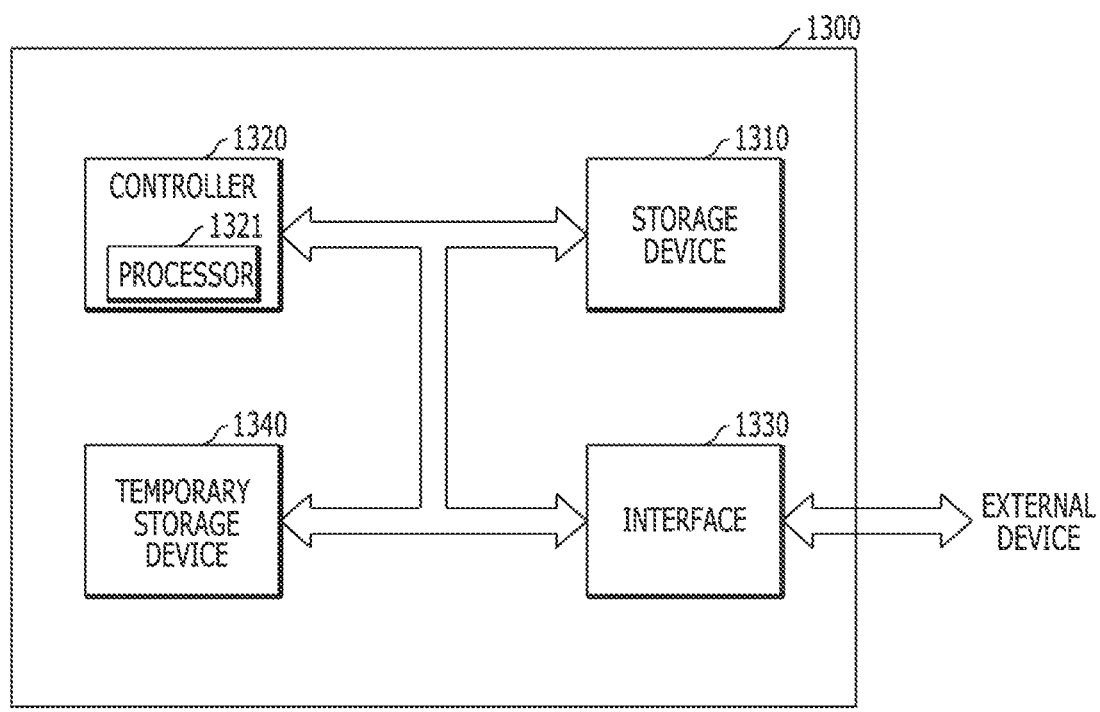
FIG. 16 illustrates a data storage system implementing memory circuitry based on the disclosed technology.

FIG. 16 is an example of configuration diagram of a data storage system implementing memory circuitry based on the disclosed technology.

Referring to FIG. 16, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory, an SD card, a micro SD card, an SDHC card, a memory stick, an SM card, an MMC card, an eMMC, a CF card, and so on.

The storage device 1310 may include a nonvolatile memory which stores data semi-permanently. The nonvolatile memory may include a ROM, a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory, an SD card, a micro SD card, an SDHC card, a memory stick, an SM card, an MMC card, an eMMC, a CF card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB, and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with embodiments of the present disclosure such as described with respect to FIGS. 4A and 4B and FIGS. 8A-12B. Through this, operating characteristics of the storage device 1310 or the temporary storage device 1340 may be improved. As a consequence, operating characteristics and data storage characteristics of the data storage system 1300 may be improved.

Figure 17:
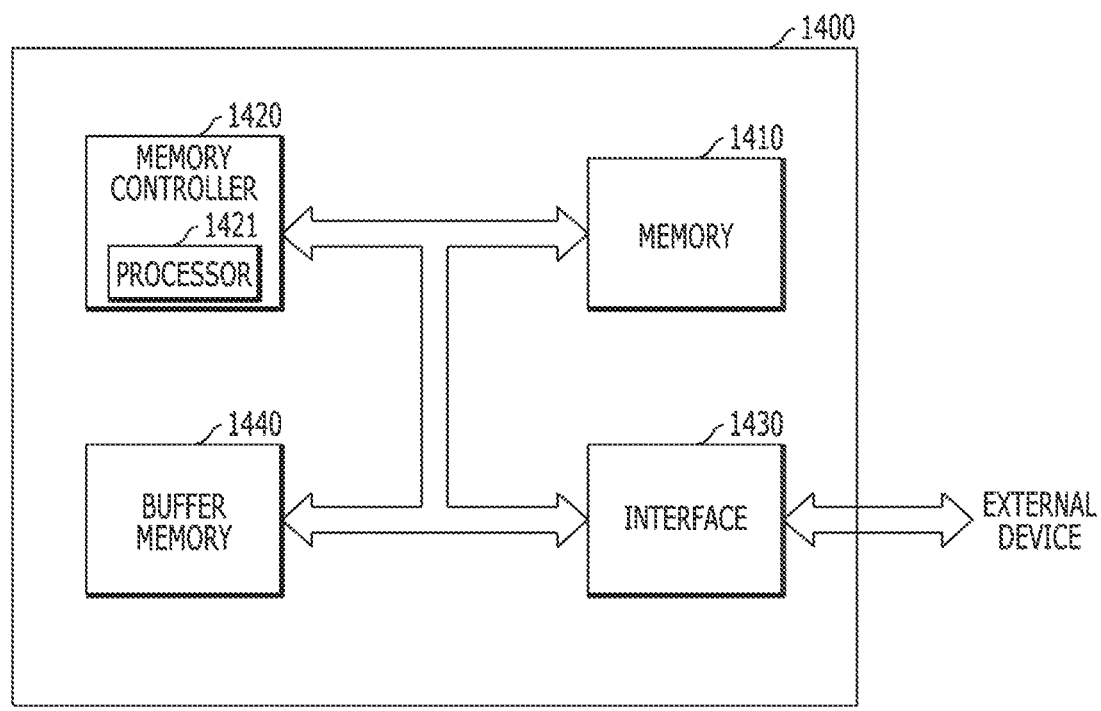
FIG. 17 illustrates a memory system implementing memory circuitry based on the disclosed technology.

FIG. 17 is an example of configuration diagram of a memory system implementing memory circuitry based on the disclosed technology.

Referring to FIG. 17, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory, an SD card, a micro SD card, an SDHC card, a memory stick, an SM card, an MMC card, an eMMC, a CF card, and so on.

The memory 1410 for storing data may include one or more of the above-described semiconductor devices in accordance with embodiments of the present disclosure such as described with respect to FIGS. 4A and 4B and FIGS. 8A-12B. Through this, operating characteristics of the memory 1410 may be improved. As a consequence, operating characteristics and data storage characteristics of the memory system 1400 may be improved.

Also, the memory 1410 according to the present implementation may further include a ROM, a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory, an SD card, a micro SD card, an SDHC card, a memory stick, an SM card, an MMC card, an eMMC, a CF card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with embodiments of the present disclosure. Through this, operating characteristics of the buffer memory 1440 may be improved. As a consequence, operating characteristics and data storage characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 13-17 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

Although various embodiments have been described for illustrative purposes, it will be apparent to those skilled in the art that various changes and modifications may be made without departing from the spirit and scope of the invention as defined in the following claims.

What is claimed is:

1. An electronic device comprising a semiconductor memory, the semiconductor memory comprising:
   a first variable resistance element coupled between a first wiring and a second wiring, the first variable resistance element including a first variable resistance layer having a first width at a first distance from the first wiring; and
   a second variable resistance element coupled between the second wiring and a third wiring, the second variable resistance element including a second variable resistance layer having a second width at the first distance from the second wiring,
   wherein the first width is greater than the second width,
   wherein the second variable resistance layer has a third width at a second distance from the second wiring, the second distance being different from the first distance, the third width being greater than the second width, and
   wherein a first composition of the second variable resistance layer at the second width is different from a second composition of the second variable resistance layer at the third width.

2. The electronic device of claim 1, wherein the first and second variable resistance layers each include a phase change material, and crystal growth directions of the first and second variable resistance layers during a set operation coincide with directions of currents flowing through the first and second variable resistance layers, respectively.

3. The electronic device of claim 2, wherein a current of the set operation of the second variable resistance element flows from the second wiring towards the third wiring.

4. The electronic device of claim 3,
   wherein when the second wiring is a source of the current of the set operation of the second variable resistance element, the second wiring is a source of a current of the set operation of the first variable resistance element, and wherein when the second wiring is a sink of the current of the set operation of the second variable resistance element, and the second wiring is a sink of the current of the set operation of the first variable resistance element.

5. The electronic device of claim 1, wherein the second variable resistance element further comprises a selection layer, a heating material, or both coupled to an end of the second variable resistance element closer to the third width than to the second width.

6. The electronic device of claim 1, wherein the first variable resistance layer has a fourth width at the first distance from the first wiring, the fourth width being orthogonal to the first width,
   wherein the second variable resistance layer has a fifth width at the first distance from the second wiring, the fifth width being orthogonal to the second width, and
   wherein the fourth width is greater than the fifth width.

7. The electronic device of claim 1, wherein a width of the second variable resistance layer decreases from a first end of the second variable resistance layer to a second end of the second variable resistance layer.

8. The electronic device of claim 7, wherein a width of all side surfaces of the second variable resistance layer decreases from the first end to the second end.

9. The electronic device of claim 1, wherein the first variable resistance element is disposed at an intersection of the first wiring and the second wiring, and
   wherein the second variable resistance element is disposed at an intersection of the second wiring and the third wiring.

10. An electronic device comprising a semiconductor memory, wherein the semiconductor memory comprises:
    a first wiring, a second wiring and a third wiring that are arranged so as to be isolated from one another, wherein the second wiring is extended in a direction intersecting the first and third wirings;
    a first variable resistance element interposed between the first and second wirings, overlapping an intersection between the first and second wirings, and comprising a first variable resistance layer; and
    a second variable resistance element interposed between the second and third wirings, overlapping an intersection between the second and third wirings, and comprising a second variable resistance layer,
    wherein during a set operation, the direction of a current flowing through the first variable resistance element coincides with a temperature increase direction in the first variable resistance element, the direction of a current flowing through the second variable resistance element is opposite to a temperature increase direction in the second variable resistance element, and a width of the second variable resistance layer at a second location is larger than a width of the second variable resistance layer at a first location when a current flows from the second location to the first location in the second variable resistance layer, and
    wherein a part of the second variable resistance layer at the first location and a part of the second variable resistance layer at the second location are formed of different materials.

11. The electronic device of claim 10, wherein a change in width of the second variable resistance layer is larger than a change in width of the first variable resistance layer.

12. The electronic device of claim 10, wherein the first and second variable resistance layers comprise a phase change material, and crystal growth directions of the first and second variable resistance layers coincide with the directions of currents flowing through the first and second variable resistance elements, respectively.

13. The electronic device of claim 10, wherein when the direction of the current flowing through the first variable resistance element is a direction from the first wiring to the second wiring, the direction of the current flowing through the second variable resistance element is a direction from the third wiring to the second wiring,
wherein when the direction of the current flowing through the first variable resistance element is a direction from the second wiring to the first wiring, the direction of the current flowing through the second variable resistance element is a direction from the second wiring to the third wiring,
wherein during the set operation, the temperature increase direction of the first variable resistance element and the temperature increase direction of the second variable resistance element coincide with each other.

14. The electronic device of claim 10, wherein the first variable resistance element further comprises a first selection element layer, and
the second variable resistance element further comprises a second selection element layer,
wherein during the set operation, the temperature increase direction of the first variable resistance element is a direction from the first variable resistance layer to the first selection element layer,
wherein during the set operation, the temperature increase direction of the second variable resistance element is a direction from the second variable resistance layer to the second selection element layer.

15. The electronic device of claim 10, wherein the width of the second variable resistance layer decreases in a gradual or stepwise manner from the second location to the first location.

16. The electronic device of claim 10, wherein a current flows from the second wiring to the first and third wirings,
wherein during the set operation, the temperature of the first variable resistance element increases in a direction from the second wiring to the first wiring,
wherein during the set operation, the temperature of the second variable resistance element increases in a direction from the third wiring to the second wiring,
wherein the first location is closer to the third wiring than the second location.

17. The electronic device of claim 10, wherein a current flows from the first and third wirings toward the second wiring,
wherein during the set operation, the temperature of the first variable resistance element increases in a direction from the first wiring to the second wiring,
wherein during the set operation, the temperature of the second variable resistance element increases in a direction from the second wiring to the third wiring,
wherein the first location is closer to the second wiring than the second location.

18. The electronic device of claim 10, wherein a current flows from the second wiring toward the first and third wirings,
wherein during the set operation, the temperature of the first variable resistance element increases in a direction from the second wiring to the first wiring,
wherein during the set operation, the temperature of the second variable resistance element increases in a direction from the third wiring to the second wiring,
wherein the first location is closer to the first wiring than the second location.

19. The electronic device of claim 10, wherein a current flows from the first and third wirings toward the second wiring,
wherein during the set operation, the temperature of the first variable resistance element increases in a direction from the first wiring to the second wiring,
wherein during the set operation, the temperature of the second variable resistance element increases in a direction from the second wiring to the third wiring,
wherein the first location is closer to the second wiring than the second location.

20. The electronic device of claim 10, wherein the semiconductor memory further comprises:
a fourth wiring disposed at one side of the third wiring in the arrangement direction of the first to third wirings so as to be isolated from the third wiring, and extended in a direction intersecting the third wiring; and
a third variable resistance element interposed between the third and fourth wirings, overlapping an intersection between the third and fourth wirings, and comprising a third variable resistance layer,
wherein the third variable resistance layer has the same width as the first variable resistance layer.

21. The electronic device of claim 20, wherein the semiconductor memory further comprises:
a fifth wiring disposed at one side of the fourth wiring in the arrangement direction of the first to third wirings so as to be isolated from the fourth wiring, and extended in a direction intersecting the fourth wiring; and
a fourth variable resistance element interposed between the fourth and fifth wirings, overlapping an intersection between the fourth and fifth wirings, and comprising a fourth variable resistance layer,
wherein the fourth variable resistance layer has the same width as the second variable resistance layer.

22. An electronic device comprising a semiconductor memory, wherein the semiconductor memory comprises:
a first wiring, a second wiring and a third wiring that are arranged so as to be isolated from one another, wherein the second wiring is extended in a direction intersecting the first and third wirings;
a first variable resistance element interposed between the first and second wirings, overlapping an intersection between the first and second wirings, and comprising a first variable resistance layer; and
a second variable resistance element interposed between the second and third wirings, overlapping an intersection between the second and third wirings, and comprising a second variable resistance layer,
wherein during a set operation, the direction of a current flowing through the first variable resistance element coincides with a temperature increase direction in the first variable resistance element, the direction of a current flowing through the second variable resistance element is opposite to a temperature increase direction in the second variable resistance element, and the second variable resistance layer includes a first portion having a first width and a second portion having a second width larger than the first width when a current flows from the second portion to the first portion in the second variable resistance layer,
wherein the first portion and the second portion of the second variable resistance layer form a stepwise shape, and wherein the first variable resistance element has the second width.

\* \* \* \* \*